(12) United States Patent
Kakehata et al.

(10) Patent No.: US 7,989,315 B2
(45) Date of Patent: Aug. 2, 2011

(54) METHOD FOR MANUFACTURING SEMICONDUCTOR DEVICE

(75) Inventors: Tetsuya Kakehata, Isehara (JP); Takashi Kudo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 56 days.

(21) Appl. No.: 12/624,691

(22) Filed: Nov. 24, 2009

(65) Prior Publication Data
US 2010/0136765 A1   Jun. 3, 2010

(30) Foreign Application Priority Data
Nov. 28, 2008   (JP) .................................. 2008-303435

(51) Int. Cl.
*H01L 21/762* (2006.01)
(52) U.S. Cl. ................. 438/458; 257/E21.568
(58) Field of Classification Search .................. 438/458, 438/459, 510, 513, 514, 142, 33, 68, 113
See application file for complete search history.

(56) References Cited

U.S. PATENT DOCUMENTS

| | | | |
|---|---|---|---|
| 5,374,564 A | 12/1994 | Bruel | |
| 6,777,820 B2 | 8/2004 | Chiba et al. | |
| 6,953,948 B2 | 10/2005 | Sakaguchi | |
| 7,601,601 B2 * | 10/2009 | Yamazaki et al. | ............ 438/311 |

FOREIGN PATENT DOCUMENTS

| | | |
|---|---|---|
| JP | 05-211128 | 8/1993 |
| JP | 2000-223380 | 8/2000 |
| JP | 2003-078115 | 3/2003 |
| JP | 2007-036279 | 2/2007 |
| JP | 2007-049206 | 2/2007 |

* cited by examiner

*Primary Examiner* — Savitri Mulpuri
(74) *Attorney, Agent, or Firm* — Eric J. Robinson; Robinson Intellectual Property Law Office, P.C.

(57) ABSTRACT

When printing is performed on a base substrate with a laser after a single crystal silicon layer is transferred to the base substrate, there are problems such as ablation of the single crystal silicon layer in the peripheral portion of a printed dot or attachment of glass chips or the like to the surface of the single crystal silicon layer. After printing is performed on the bonding surface of a silicon wafer with a laser, the surface of the silicon wafer is polished by CMP (chemical mechanical polishing), so that the projection in the peripheral portion of the printed dot is removed. After that, the silicon wafer is bonded to the base substrate. Since the depression of the printed dot remains to some extent by a chemical etching effect even after the polishing by CMP, the single crystal silicon layer is not transferred only at the depression portion at the time of the transfer; accordingly, the information is left on the base substrate.

13 Claims, 17 Drawing Sheets

FIG. 4A1
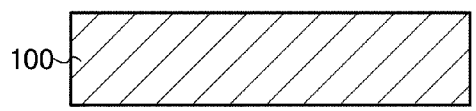
FIG. 4A2
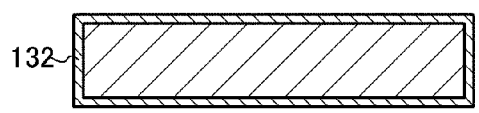
FIG. 4A3
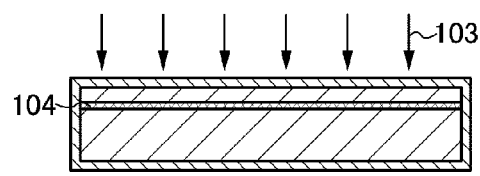
FIG. 4B1
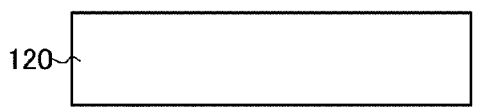
FIG. 4B2
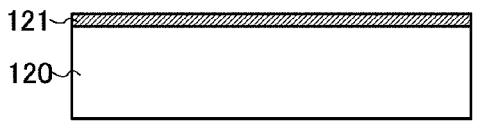
FIG. 4C
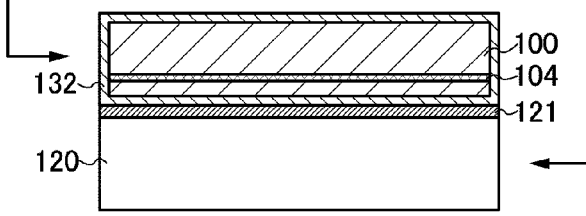
FIG. 4D
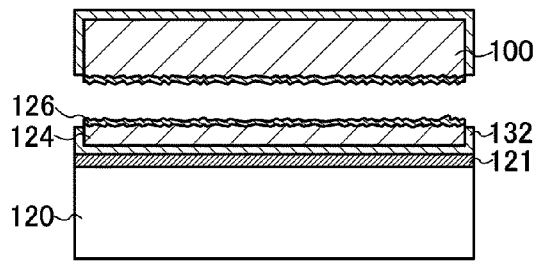

METHOD FOR MANUFACTURING SEMICONDUCTOR DEVICE

BACKGROUND OF THE INVENTION

1. Field of the Invention

The present invention relates to a method for manufacturing a substrate provided with a semiconductor layer with an insulating layer therebetween, and particularly relates to a method for manufacturing an SOI (silicon on insulator) substrate. In addition, the present invention relates to a method for manufacturing a semiconductor device using a substrate over which a semiconductor layer is provided with an insulating layer interposed therebetween.

2. Description of the Related Art

In recent years, integrated circuits using an SOI substrate where a thin single crystal semiconductor layer is formed on an insulating surface, instead of a bulk silicon wafer, have been developed. The use of an SOI substrate can reduce parasitic capacitance between a drain of a transistor and a substrate; thus, SOI substrates have attracted attention for their ability to improve performance of semiconductor integrated circuits.

Smart Cut (registered trademark) method is known as one of methods for manufacturing an SOI substrate (for example, see Patent Document 1). An outline of a method for manufacturing an SOI substrate by Smart Cut method is described below. First, hydrogen ions are implanted into a silicon wafer by an ion implantation method to form a microbubble layer at a predetermined depth from the surface. Next, the silicon wafer into which hydrogen ions have been implanted is bonded to another silicon wafer with a silicon oxide film interposed therebetween. Then, by heat treatment, the microbubble layer serves as a cleavage plane and part of the silicon wafer into which hydrogen ions have been implanted is separated in a thin film shape along the microbubble layer. Accordingly, a single crystal silicon film can be formed over the other bonded silicon wafer. Smart Cut method may also be referred to as a hydrogen ion implantation separation method.

In addition, a method has also been proposed in which a single crystal silicon layer is formed over a base substrate formed using glass by such Smart Cut method. Since glass substrates can have a larger area and are less expensive than silicon wafers, the glass substrates are mainly used in manufacturing liquid crystal display devices and the like. A large-sized inexpensive SOI substrate can be manufactured using such a glass substrate as a base substrate.

[Reference]

[Patent Document 1] Japanese Published Patent Application No. H05-211128

SUMMARY OF THE INVENTION

In the case where printing is performed on the bonding surface of a silicon wafer with a laser in the method by which a single crystal silicon layer is formed over a base substrate formed of glass, the printed portion has a depression at the center and a projection at a peripheral portion; thus, the bonding cannot be performed well.

In the case where printing is performed on the base substrate with a laser after the single crystal silicon layer is transferred to the base substrate, there are problems such as ablation of the single crystal silicon layer in the peripheral portion of the printed dot or attachment of glass chips or the like to the surface of the single crystal silicon layer.

The present invention provides a method for leaving information about a silicon wafer on the base substrate by a laser mark.

After printing is performed on the bonding surface of the silicon wafer with a laser, the surface of the silicon wafer is polished by CMP (chemical mechanical polishing), so that the projection in the peripheral portion of the printed dot is removed. After that, the silicon wafer is bonded to the base substrate. Since the depression of the printed dot remains to some extent by a chemical etching effect even after the polishing by CMP, the single crystal silicon layer is not transferred only at the depression portion at the time of the transfer; accordingly, the information is left on the base substrate.

A method for manufacturing a semiconductor device according to a first embodiment of the present invention in order to solve the above problems includes the steps of: performing printing on a single crystal semiconductor substrate with a laser to generate a projection at a peripheral portion of a printed portion; polishing the single crystal semiconductor substrate by chemical mechanical polishing to planarize the projection; forming an embrittlement region in the single crystal semiconductor substrate; bonding a surface of a base substrate and a surface of the single crystal semiconductor substrate; and heating the base substrate and the single crystal semiconductor substrate to leave a single crystal semiconductor layer except for the printed portion over the base substrate.

In the above embodiment, the base substrate has a light-transmitting property.

A method for manufacturing a semiconductor device according to a second embodiment of the present invention in order to solve the above problems includes the steps of: performing printing on a single crystal semiconductor substrate with a laser to generate a projection at a peripheral portion of a printed portion; polishing the single crystal semiconductor substrate by chemical mechanical polishing to planarize the projection; forming a first embrittlement region in the single crystal semiconductor substrate; bonding a surface of a first base substrate and a surface of the single crystal semiconductor substrate; heating the first base substrate and the single crystal semiconductor substrate to leave a first single crystal semiconductor layer except for the printed portion over the first base substrate; polishing the single crystal semiconductor substrate by chemical mechanical polishing to planarize the single crystal semiconductor substrate; forming a second embrittlement region in the single crystal semiconductor substrate; bonding a surface of a second base substrate and a surface of the single crystal semiconductor substrate; and heating the second base substrate and the single crystal semiconductor substrate to leave a second single crystal semiconductor layer except for the printed portion over the second base substrate.

In the above embodiment, the height of the projection is equal to or greater than 0.1 µm and equal to or less than 5 µm from the surface of the single crystal semiconductor substrate.

In the above embodiment, the printing is performed at a depth of equal to or greater than 0.5 µm and equal to or less than 10 µm.

A method for manufacturing a semiconductor device according to a third embodiment of the present invention in order to solve the above problems includes the steps of: performing first printing on a single crystal semiconductor substrate with a laser to generate a first projection at a peripheral portion of a first printed portion; polishing the single crystal semiconductor substrate by chemical mechanical polishing to planarize the first projection; forming a first embrittlement region in the single crystal semiconductor substrate; bonding a surface of a first base substrate and a surface of the single crystal semiconductor substrate; heating the first base substrate and the single crystal semiconductor substrate to leave a first single crystal semiconductor layer except for the first printed portion over the first base substrate; performing second printing on the single crystal semiconductor substrate with a laser to generate a second projection at a peripheral portion of a second printed portion; polishing the single crystal semiconductor substrate by chemical mechanical polishing to planarize the second projection; forming a second embrittlement region in the single crystal semiconductor substrate; bonding a surface of a second base substrate and a surface of the single crystal semiconductor substrate; and heating the second base substrate and the single crystal semiconductor substrate to leave a second single crystal semiconductor layer except for the first printed portion and the second printed portion over the second base substrate.

In the above embodiment, the heights of the first projection and the second projection are equal to or greater than 0.1 µm and equal to or less than 5 µm from the respective surfaces of the single crystal semiconductor substrate.

In the above embodiment, the first printing and the second printing are performed at a depth of equal to or greater than 0.5 µm and equal to or less than 10 µm.

In the second and third embodiments, the first base substrate and the second base substrate have a light-transmitting property.

According to one embodiment of the present invention, information about a silicon wafer is left on a base substrate; thus, the process management becomes easy.

In addition, even when printing is performed with a laser, the effect (defective bonding, attachment of glass chips to the surface of the single crystal silicon layer, or the like) of particles due to the printing can be suppressed.

According to one embodiment of the present invention, a single crystal silicon layer is transferred to a light-transmitting substrate, whereby the information can be confirmed visually.

BRIEF DESCRIPTION OF THE DRAWINGS

In the accompanying drawings:
FIGS. 4A1 to 4A3, FIGS. 4B1 and 4B2, FIG. 4C, and FIG. 4D are views illustrating Embodiment 2.

DETAILED DESCRIPTION OF THE INVENTION

Embodiments according to one embodiment of the present invention are described in detail with reference to the drawings. However, the present invention is not limited to the following description, and it is easily understood by those skilled in the art that the modes and details disclosed herein can be modified in a variety of ways without departing from the scope and the spirit of the present invention. Therefore, the present invention should not be interpreted as being limited to the description of the embodiments given below.

Embodiment 1

In this embodiment, an example of a method for manufacturing an SOI substrate will be described with reference to the drawings. Specifically, a process in which a single crystal semiconductor layer is formed over a base substrate by Smart Cut method with an insulating layer interposed therebetween is described.

Figure 1A:
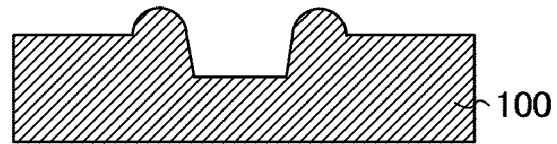
FIGS. 1A to 1D are views illustrating Embodiment 1.
Figure 2A:
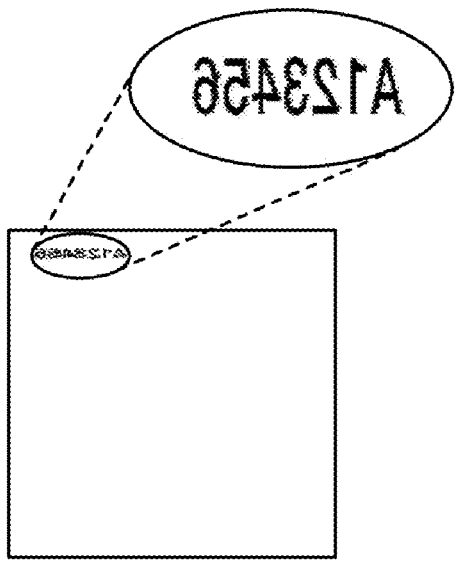
FIGS. 2A and 2B are views illustrating Embodiments 1 and 2.
Figure 3A:
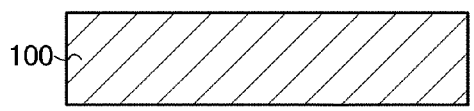
FIGS. 3A to 3E are views illustrating Embodiment 1.

First, a single crystal semiconductor substrate 100 is prepared (see FIG. 3A). With the use of a laser (for example, a second harmonic of an Nd:YVO$_4$ laser at 532 nm), printing is performed on a bonding surface at a depth of approximately 0.5 µm to 10 µm. As for the printing, for example, a silicon wafer ID, a lot number, the number of times of reusing the substrate, and the like are printed (see FIG. 1A). Here, mirror reversed letters are printed, whereby the letters are easily read on a base substrate after transfer (see FIG. 2A).

Figure 1B:
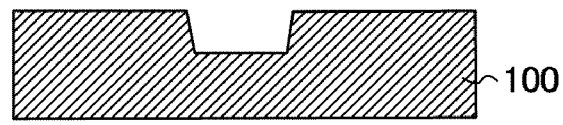

The bonding surface is polished by CMP. Through CMP, the bonding surface is polished by mechanical polishing, so that a projection (0.1 µm to 5 µm) at a peripheral portion of a printed portion is removed, while a depression at the center of the printed portion is left by chemical polishing (FIG. 1B). The polishing ratio between the mechanical polishing and the chemical polishing is changed, whereby the depth of the depression can be changed.

As the single crystal semiconductor substrate 100, a single crystal semiconductor substrate formed using an element of Group 14, such as a single crystal silicon substrate, a single crystal germanium substrate, or a single crystal silicon germanium substrate, can be used. Alternatively, a compound semiconductor substrate including gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 100 is not limited to a circular shape, and a single crystal semiconductor substrate processed into, for example, a rectangular shape or the like can also be used.

Figure 3B:

Next, a base substrate 120 is prepared (see FIG. 3B).

As the base substrate 120, a substrate formed using an insulator can be used. Specifically, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be given. Alternatively, a single crystal semiconductor substrate (for example, a single crystal silicon substrate or the like) may be used as the base substrate 120. In this embodiment, the case of using a glass substrate is described. With the use of a glass substrate which can have a large area and is inexpensive as the base substrate 120, the cost can be reduced. In addition, with the use of a glass substrate having a light-transmitting property, a laser mark can be confirmed visually.

Figure 1C:
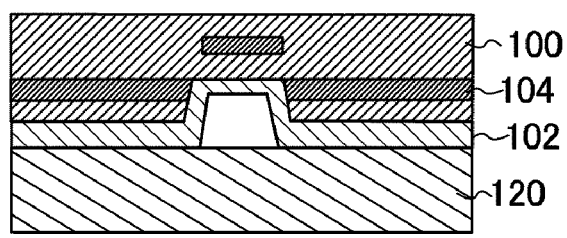
Figure 3C:
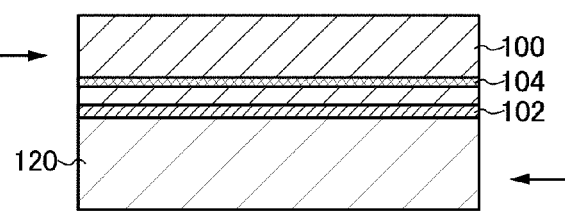

Next, an embrittlement region 104 whose crystal structure is damaged is formed at a predetermined depth from a surface of the single crystal semiconductor substrate 100. After that, the single crystal semiconductor substrate 100 and the base substrate 120 are bonded to each other with an insulating layer 102 interposed therebetween (see FIG. 1C and FIG. 3C).

The embrittlement region 104 can be formed by irradiation of the single crystal semiconductor substrate 100 with ions of hydrogen or the like having kinetic energy.

As the insulating layer 102, a single layer of an insulating layer such as a silicon oxide film, a silicon oxynitride film, a silicon nitride film, or a silicon nitride oxide film, or a stacked layer thereof can be used. These films can be formed by a thermal oxidation method, a CVD method, a sputtering method, or the like.

In this specification, silicon oxynitride means a substance which contains more oxygen than nitrogen and, in the case where measurements are performed by rutherford backscattering spectrometry (RBS) and hydrogen forward scattering (HFS), preferably contains oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively. Further, silicon nitride oxide means a substance that includes more nitrogen than oxygen and, in the case where measurements are performed using RBS and HFS, includes oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in silicon oxynitride or silicon nitride oxide is defined as 100 atomic %.

Figure 3D:
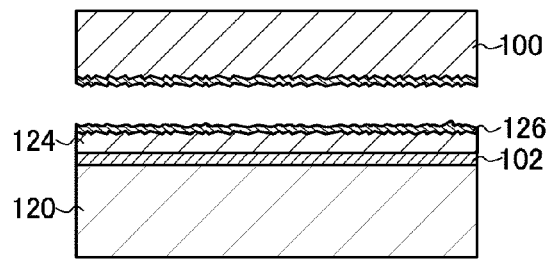
Figure 3E:
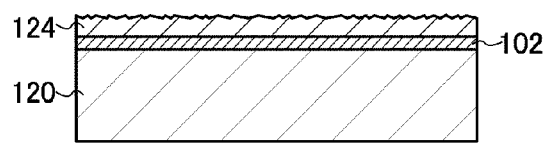

Next, a single crystal semiconductor layer 124 is provided over the base substrate 120 with the insulating layer 102 interposed therebetween by separation along the embrittlement region 104 using heat treatment (see FIG. 3D).

When the heat treatment is performed, the element added is separated out in microvoids which are formed in the embrittlement region 104, and the internal pressure of the microvoids is increased. By the increase in pressure, the microvoids in the embrittlement region 104 are changed in volume and a crack is generated in the embrittlement region 104. Thus, the single crystal semiconductor substrate 100 is separated along the embrittlement region 104. Since the insulating layer 102 is bonded to the base substrate 120, the single crystal semiconductor layer 124 which is separated from the single crystal semiconductor substrate 100 is formed over the base substrate 120.

Figure 1D:
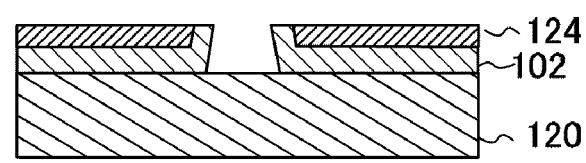
Figure 2B:
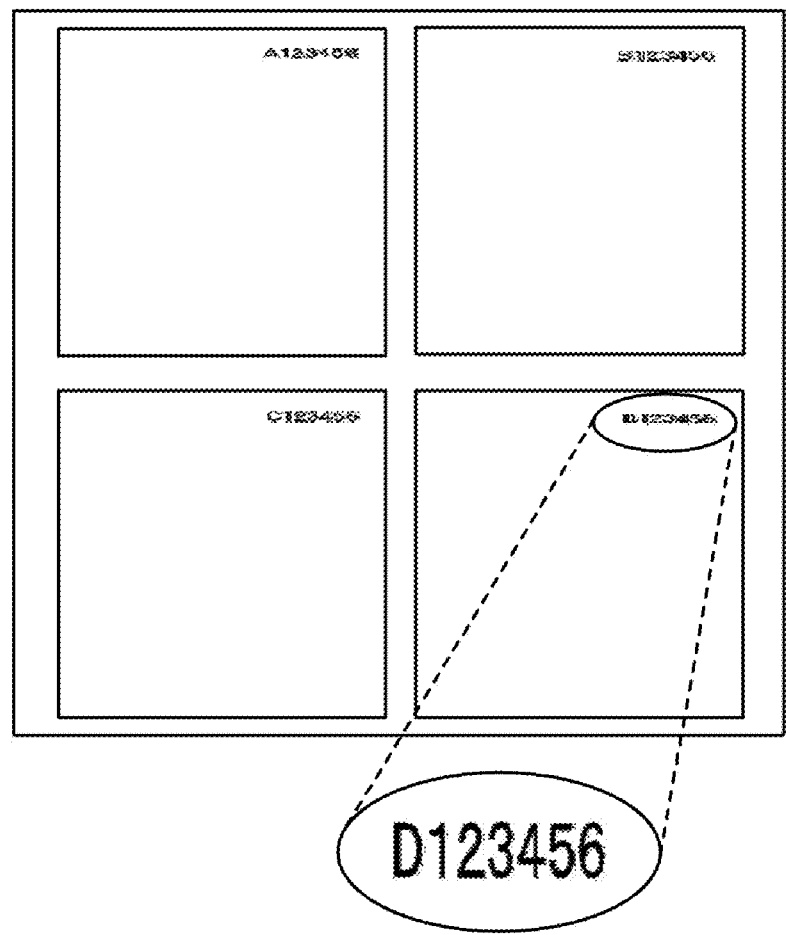

In such a manner, as well as the single crystal semiconductor layer, the mark on the single crystal semiconductor substrate is transferred to the base substrate (see FIG. 1D and FIG. 2B). After that, the single crystal semiconductor substrate is subjected again to printing with a laser, and then to reprocessing such as CMP. It is efficient that a step of printing a laser mark is performed simultaneously with the reprocessing. The semiconductor substrate which is subjected to the reprocessing returns to the beginning of this embodiment and is used as a new semiconductor substrate.

In addition, although microscopic dust which is cutting scrap is attached to the single crystal semiconductor substrate after the laser mark is printed, the microscopic dust is removed by CMP. This is an advantageous effect as compared to a method for printing a laser mark after the transfer. This is because a cleaning step to remove microscopic dust which is cutting scrap is necessary when the laser mark is printed after the transfer. Attachment of microscopic dust to the semiconductor layer causes generation of a defect when laser treatment (recrystallization or the like) is performed. In the present invention, this cleaning step can be omitted.

Note that the structure described in this embodiment can be implemented in combination with any of the structures described in the other embodiments in this specification, as appropriate.

Embodiment 2

In this embodiment, an example of bonding the single crystal semiconductor substrate 100 and the base substrate 120 is described with reference to the drawings.

First, the single crystal semiconductor substrate 100 is prepared (see FIG. 4A1). With the use of a laser (for example, a second harmonic of an Nd:YVO$_4$ laser at 532 nm), printing is performed on a bonding surface at a depth of approximately 0.5 μm to 10 μm. As for the printing, for example, a silicon wafer ID, a lot number, the number of times of reusing the substrate, and the like are printed. Here, mirror reversed letters are printed, whereby the letters are easily read on a base substrate after transfer.

The bonding surface is polished by CMP. Through CMP, the bonding surface is polished by mechanical polishing, so that a projection (0.1 μm to 5 μm) at a peripheral portion of a printed portion is removed, while a depression at the center of the printed portion is left by chemical polishing (FIG. 1B). The polishing ratio between the mechanical polishing and the chemical polishing is changed, whereby the depth of the depression can be changed.

Next, a bonding step is performed. In terms of removing contaminants, it is preferable that the bonding surface of the single crystal semiconductor substrate 100 be cleaned in advance using a sulfuric acid/hydrogen peroxide mixture (SPM), an ammonium hydroxide/hydrogen peroxide mixture (APM), a hydrochloric acid/hydrogen peroxide mixture (HPM), diluted hydrofluoric acid (DHF), or the like as appropriate. Alternatively, diluted hydrofluoric acid and ozone water may be discharged alternately to clean the bonding surface of the single crystal semiconductor substrate 100.

Next, an oxide film 132 is formed on the surface of the single crystal semiconductor substrate 100 (see FIG. 4A2).

As the oxide film 132, for example, a single layer of a silicon oxide film, a silicon oxynitride film, or the like, or a stacked layer thereof can be used. These films can be formed by a thermal oxidation method, a CVD method, a sputtering method, or the like.

In this embodiment, thermal oxidation treatment is performed on the single crystal semiconductor substrate 100 to form the oxide film 132 (here, a SiO$_x$ film) (see FIG. 4A2).

The thermal oxidation treatment is preferably performed in an oxidation atmosphere to which halogen is added. For example, thermal oxidation treatment (HCl oxidation) is performed on the single crystal semiconductor substrate 100 in an oxidation atmosphere to which chlorine (Cl) is added, whereby the oxide film 132 is formed through oxidation. In this case, the oxide film 132 contains chlorine atoms.

The chlorine atom which is contained in the oxide film 132 forms a distortion. As a result, the moisture absorptance of the oxide film 132 is increased and the diffusion rate is increased. That is, in the case where moisture exists on the surface of the oxide film 132, moisture on the surface can be rapidly absorbed and diffused into the oxide film 132.

As an example of the thermal oxidation treatment, thermal oxidation can be performed in an oxidation atmosphere containing hydrogen chloride (HCl) at 0.5 vol % to 10 vol % (preferably 3 vol %) with respect to oxygen, at a temperature of 900° C. to 1150° C. (typically, 1000° C.). The treatment time may be 0.1 hour to 6 hours, preferably 0.5 hour to 1 hour. The thickness of the formed oxide film is 10 nm to 1000 nm (preferably, 50 nm to 300 nm), for example, 100 nm.

In this embodiment, the concentration of chlorine atoms contained in the oxide film 132 is preferably controlled to be $1 \times 10^{17}$ atoms/cm$^3$ to $1 \times 10^{21}$ atoms/cm$^3$.

Chlorine atoms are contained in the oxide film 132, whereby a heavy metal (for example, Fe, Cr, Ni, Mo, or the like) which is an extrinsic impurity is captured and thus the single crystal semiconductor substrate 100 can be prevented from being contaminated.

When a halogen such as chlorine is contained in the oxide film 132 by HCl oxidation or the like, it is possible to perform gettering on an impurity (for example, a mobile ion such as Na) which adversely affects the single crystal semiconductor substrate. That is, by heat treatment performed after the oxide film 132 is formed, an impurity contained in the single crystal semiconductor substrate is separated out to the oxide film 132 and reacted with a halogen (for example, chlorine) to be captured. Thus, the impurity captured in the oxide film 132 can be fixed and contamination of the single crystal semiconductor substrate 100 can be prevented. In addition, when the oxide film 132 is attached to a glass substrate, the oxide film 132 functions as a film which fixes an impurity such as Na contained in glass.

In particular, inclusion of a halogen such as chlorine in the oxide film 132 by HCl oxidation or the like is effective in removing contaminants in the case where a semiconductor substrate is not cleaned sufficiently or the case where a semiconductor substrate is reused repeatedly.

Further, halogen atoms contained in the oxide film 132 are not limited to chlorine atoms. Fluorine atoms may be contained in the oxide film 132. For example, thermal oxidation treatment may be performed on the single crystal semiconductor substrate 100 in an oxidation atmosphere after the surface of the single crystal semiconductor substrate 100 is immersed in an HF solution, or thermal oxidation treatment may be performed in an oxidation atmosphere to which NF$_3$ is added.

Next, the single crystal semiconductor substrate 100 is irradiated with ions having kinetic energy to form the embrittlement region 104 having a damaged crystal structure at a predetermined depth of the single crystal semiconductor substrate 100 (see FIG. 4A3). As illustrated in FIG. 4A3, the single crystal semiconductor substrate 100 is irradiated with accelerated ions 103 through the oxide film 132, whereby the accelerated ions 103 are added to a region at a predetermined depth from the surface of the single crystal semiconductor substrate 100; thus, the embrittlement region 104 can be formed. The accelerated ions 103 are obtained in such a manner that a source gas is excited to produce plasma of the source gas and the ions contained in the plasma are extracted from the plasma by an electric field effect and accelerated.

The depth of the region where the embrittlement region 104 is formed can be adjusted by the kinetic energy, the mass, the charge, and the incidence angle of the ions 103. The kinetic energy can be adjusted by the acceleration voltage, the dose, or the like. Note that the embrittlement region 104 is formed at the same depth or substantially the same depth as the average penetration depth of the ions 103. Therefore, the thickness of the single crystal semiconductor layer separated from the single crystal semiconductor substrate 100 can be determined by the depth at which the accelerated ions 103 are added. The depth at which the embrittlement region 104 is formed is adjusted so that the thickness of the single crystal semiconductor layer becomes 10 nm to 500 nm inclusive, preferably 50 nm to 200 nm inclusive.

The embrittlement region 104 can be formed by ion doping treatment. The ion doping treatment can be performed with an ion doping apparatus. A typical example of the ion doping apparatus is a non-mass-separation type apparatus which irradiates a process object which is disposed in a chamber with all kinds of ions which are produced by plasma excitation of a process gas. The apparatus is called a non-mass-separation type apparatus because a process object is irradiated with all kinds of ions without mass-separating ions in plasma. In contrast, an ion implantation apparatus is a mass-separation type apparatus. The ion implantation apparatus is an apparatus with which a process object is irradiated with ion species having a specific mass through mass separation of ion species in plasma.

The ion doping apparatus includes a chamber in which a process object is disposed, an ion source for producing desired ions, an acceleration mechanism for acceleration of ions and for irradiation therewith, and the like. The ion source includes a gas supply device which supplies a source gas to produce a desired ion species, an electrode for excitement of the source gas to produce plasma, and the like. As the electrode for production of plasma, a filament type electrode, a capacitive coupling high frequency discharging electrode, or the like is used. The acceleration mechanism includes electrodes such as an extraction electrode, an acceleration electrode, a deceleration electrode, and a ground electrode; a power source for supply of power to these electrodes; and the like. The electrodes that are included in the acceleration mechanism are provided with a plurality of openings or slits, through which ions that are produced from the ion source are accelerated. Note that the components of the ion doping apparatus are not limited to the above-mentioned components, and a mechanism as needed is provided.

In this embodiment, hydrogen is added to the single crystal semiconductor substrate 100 with an ion doping apparatus. A hydrogen-containing gas is supplied as a plasma source gas. For example, H$_2$ is supplied. Plasma is produced by excitation of a hydrogen gas. Ions contained in the plasma are accelerated without mass separation and the single crystal semiconductor substrate 100 is irradiated with the accelerated ions.

In the ion doping apparatus, the percentage of H$_3^+$ to the total quantity of ion species (H$^+$, H$_2^+$, H$_3^+$) produced from a hydrogen gas is set to be 50% or more. Preferably, the percentage of H$_3^+$ is set to be 80% or more. Since mass separation is not performed in the ion doping apparatus, the percentage of one kind (H$_3^+$) to plural kinds of ion species produced in plasma is preferably set to be 50% or more, more preferably 80% or more. By irradiation with ions having the same mass, ions can be added in a concentrated manner to the same depth of the single crystal semiconductor substrate 100.

In order to form the embrittlement region 104 in a shallow region, the acceleration voltage of the accelerated ions 103 needs to be low. However, by increase in the percentage of H$_3^+$ ions in the plasma, atomic hydrogen (H) can be added to the single crystal semiconductor substrate 100 efficiently. Since the mass of H$_3^+$ ions is three times as large as that of H$^+$ ions, in the case where one hydrogen atom is added to the same depth, the acceleration voltage of H$_3^+$ ions can be three times as high as that of H$^+$ ions. When the acceleration voltage of ions can be increased, the takt time of an ion irradiation step can be shortened, and productivity and throughput can be improved.

Ion doping apparatuses are inexpensive and excellent for use in large-area treatment. Therefore, by irradiation with $H_3^+$ with the use of such an ion doping apparatus, significant effects such as improvement in semiconductor characteristics, increase in area, reduction in cost, and improvement in productivity can be obtained. Further, in the case where an ion doping apparatus is used, there is a concern that a heavy metal might also be introduced to the single crystal semiconductor substrate 100 at the same time. However, by irradiation with the ions through the oxide film 132 containing chlorine atoms, contamination of the single crystal semiconductor substrate 100 due to such a heavy metal can be prevented as described above.

Note that the step of irradiating the single crystal semiconductor substrate 100 with the accelerated ions 103 can also be performed with an ion implantation apparatus. The ion implantation apparatus is a mass-separation type apparatus with which a process object that is disposed in a chamber is irradiated with a specific ion species through mass separation of a plurality of ion species that are produced by plasma excitation of a source gas. Thus, in the case where an ion implantation apparatus is used, $H^+$ ions and $H_2^+$ ions that are produced by excitation of a hydrogen gas or a $PH_3$ gas are subjected to mass separation, and either $H^+$ ions or $H_2^+$ ions are accelerated, with which the single crystal semiconductor substrate 100 is irradiated.

Next, the base substrate 120 is prepared (see FIG. 4B1).

As the base substrate 120, a substrate formed using an insulator is used. Specifically, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be given. In this embodiment, the case of using a glass substrate is described. With the use of a glass substrate which can have a large area and is inexpensive as the base substrate 120, the cost can be reduced.

In addition, it is preferable that a surface of the base substrate 120 be cleaned in advance before the base substrate 120 is used. Specifically, ultrasonic cleaning is performed on the base substrate 120 using a hydrochloric acid/hydrogen peroxide mixture (HPM), a sulfuric acid/hydrogen peroxide mixture (SPM), an ammonium hydroxide/hydrogen peroxide mixture (APM), diluted hydrofluoric acid (DHF), or the like. For example, ultrasonic cleaning is preferably performed on the surface of the base substrate 120 using a hydrochloric acid/hydrogen peroxide mixture. The surface of the base substrate 120 can be planarized and abrasive particles left on the surface of the base substrate 120 can be removed performing such cleaning treatment.

Next, a nitrogen-containing layer 121 (for example, an insulating film containing nitrogen, such as a silicon nitride film or a silicon nitride oxide film) is formed on the surface of the base substrate 120 (see FIG. 4B2).

In this embodiment, the nitrogen-containing layer 121 serves as a layer (a bonding layer) bonded to the oxide film 132 which is provided over the single crystal semiconductor substrate 100. In addition, when the single crystal semiconductor layer having a single crystal structure is provided over the base substrate later, the nitrogen-containing layer 121 functions as a barrier layer to prevent impurities such as sodium (Na) contained in the base substrate from diffusing into the single crystal semiconductor layer.

In addition, a surface of the nitrogen-containing layer 121 is preferably smoothed in order to suppress defective bonding between the single crystal semiconductor substrate 100 and the base substrate 120. Specifically, the nitrogen-containing layer 121 is formed so that the average surface roughness (Ra) of the surface of the nitrogen-containing layer 121 is 0.5 nm or less and the root-mean-square surface roughness (Rms) thereof is 0.60 nm or less; more preferably, Ra is 0.35 nm or less and Rms is 0.45 nm or less. The thickness is preferably in the range of 10 nm to 200 nm inclusive, more preferably 50 nm to 100 nm inclusive.

Next, the surface of the single crystal semiconductor substrate 100 and the surface of the base substrate 120 are made to face each other, and the surface of the oxide film 132 and the surface of the nitrogen-containing layer 121 are bonded to each other (see FIG. 4C).

Here, a pressure of approximately 1 $N/cm^2$ to 500 $N/cm^2$, preferably approximately 1 $N/cm^2$ to 20 $N/cm^2$ is applied to one part of the single crystal semiconductor substrate 100 after the single crystal semiconductor substrate 100 and the base substrate 120 are disposed in close contact with each other with the oxide film 132 and the nitrogen-containing layer 121 interposed therebetween. Bonding between the oxide film 132 and the nitrogen-containing layer 121 begins from the part to which pressure is applied and then spontaneous bonding proceeds to the entire surface. This bonding step is performed by Van der Waals force or hydrogen bonding at the normal temperature without heat treatment. Therefore, a substrate with low heat-resistant temperature, such as a glass substrate, can be used as the base substrate 120.

Note that before the single crystal semiconductor substrate 100 is attached to the base substrate 120, surface treatment is preferably performed on the oxide film 132 formed over the single crystal semiconductor substrate 100 and the nitrogen-containing layer 121 formed over the base substrate 120.

As the surface treatment, plasma treatment, ozone treatment, megasonic cleaning, two-fluid cleaning (a method of spraying functional water such as pure water or water including hydrogen with a carrier gas such as nitrogen), or a combination of these methods can be employed. In particular, by ozone treatment, megasonic cleaning, two-fluid cleaning, or the like after plasma treatment is performed on at least one of the surfaces of the oxide film 132 and the nitrogen-containing layer 121, dusts such as an organic substance on the surfaces of the oxide film 132 and the nitrogen-containing layer 121 can be removed and the surfaces can be made hydrophilic. As a result, the bonding strength of the oxide film 132 and the nitrogen-containing layer 121 can be increased.

It is preferable that after the oxide film 132 and the nitrogen-containing layer 121 are bonded to each other, heat treatment be performed to increase the bonding strength therebetween. The heat treatment temperature is set at a temperature which does not cause a crack in the embrittlement region 104, for example, a room temperature or more and less than 400° C. Alternatively, while heating is performed at a temperature in this range, the oxide film 132 and the nitrogen-containing layer 121 may be bonded to each other. For the heat treatment, a diffusion furnace, a heating furnace such as a resistance heating furnace, a rapid thermal annealing (RTA) apparatus, a microwave heating apparatus, or the like can be used.

In general, when heat treatment is performed at the same time as or after the oxide film 132 and the nitrogen-containing layer 121 are bonded to each other, dehydration reaction proceeds at the bonding interface, the bonding surfaces come closer to each other, and thus hydrogen bonding is strengthened or covalent bonding is formed. Accordingly, the bonding is strengthened. In order to promote dehydration reaction, moisture which is produced at the bonding interface by the dehydration reaction needs to be removed by high-temperature heat treatment. That is, in the case where the heat treatment temperature after the bonding is low, moisture which is produced at the bonding interface by the dehydration reaction cannot be removed effectively; accordingly, the dehydration reaction does not proceed and it is difficult to increase the bonding strength sufficiently.

On the other hand, in the case where an oxide film containing chlorine atoms or the like is used as the oxide film 132 as described in this embodiment, the oxide film 132 can absorb and diffuse moisture. Therefore, even in the case where the heat treatment after the bonding is performed at a low temperature, moisture which is produced at the bonding interface by the dehydration reaction can be absorbed and diffused into the oxide film 132 and thus the dehydration reaction can be promoted efficiently. In this case, even in the case where a substrate with low heat resistance such as a glass substrate is used as the base substrate 120, the bonding strength between the oxide film 132 and the nitrogen-containing layer 121 can be increased sufficiently. Further, plasma treatment is performed applying bias voltage, whereby minute pores (micropores) are formed near the surface of the oxide film 132 to absorb and diffuse moisture efficiently. Thus, the bonding strength between the oxide film 132 and the nitrogen-containing layer 121 can be increased even by a low-temperature heat treatment.

Next, heat treatment is performed to cause separation along the embrittlement region 104, whereby the single crystal semiconductor layer 124 is formed over the base substrate 120 with the oxide film 132 and the nitrogen-containing layer 121 interposed therebetween (see FIG. 4D).

When the heat treatment is performed, the element added is separated out in microvoids which are formed in the embrittlement region 104, and the internal pressure of the microvoids is increased. Due to increase in pressure, change in the volume of the microvoids in the embrittlement region 104 occurs to generate cracks in the embrittlement region 104. As a result, the single crystal semiconductor substrate 100 is separated along the embrittlement region 104. Since the oxide film 132 is bonded to the nitrogen-containing layer 121 over the base substrate 120, the single crystal semiconductor layer 124 which is separated from the single crystal semiconductor substrate 100 is formed over the base substrate 120. Further, the temperature in this heat treatment is set so as not to exceed the strain point of the base substrate 120.

For this heat treatment, a diffusion furnace, a heating furnace such as a resistance heating furnace, a rapid thermal annealing (RTA) apparatus, a microwave heating apparatus, or the like can be used. For example, in the case where a RTA apparatus is used, the heat treatment can be performed at a heating temperature of 550° C. to 730° C. inclusive, within a process time of 0.5 minutes to 60 minutes inclusive.

Note that the heat treatment in FIG. 4D is performed without performing the heat treatment for increase of the bonding strength between the oxide film 132 and the nitrogen-containing layer 121, the heat treatment step which increases the bonding strength between the oxide film 132 and the nitrogen-containing layer 121 and the heat treatment step to separate the single crystal semiconductor substrate 100 along the embrittlement region 104 may be performed at the same time.

Through the above steps, an SOI substrate in which the single crystal semiconductor layer 124 is provided over the base substrate 120 with the oxide film 132 and the nitrogen-containing layer 121 interposed therebetween can be manufactured. By the manufacturing method described in this embodiment, even in the case where the nitrogen-containing layer 121 is used as the bonding layer, the bonding strength between the base substrate 120 and the single crystal semiconductor layer 124 can be increased, resulting in increase in reliability. As a result, an SOI substrate can be formed in which diffusion of impurities into the single crystal semiconductor layer 124 formed over the base substrate 120 is suppressed and at the same time the base substrate 120 and the single crystal semiconductor layer 124 are firmly attached.

Further, with the structure in which a nitrogen-containing layer is provided on the base substrate side and an oxide film including a halogen such as chlorine is formed on the single crystal semiconductor substrate side, the entry of an impurity element to the single crystal semiconductor substrate before the single crystal semiconductor substrate is attached to the base substrate can be suppressed. Furthermore, by formation of an oxide film including a halogen such as chlorine as the bonding layer provided on the single crystal semiconductor substrate side, the bonding strength can be increased by efficient promotion of dehydration reaction even in the case where the heat treatment after the bonding is performed at low temperature.

Then, after the oxide film 126 formed on the single crystal semiconductor layer 124 is removed, the single crystal semiconductor layer 124 is irradiated with a laser beam as described in Embodiment 1, whereby the crystallinity of the single crystal semiconductor layer 124 is recovered and the surface thereof is smoothed. The irradiation step of the laser beam can be performed using any of the methods and apparatuses described in the above embodiment.

Note that although the case where the oxide film 132 is formed over the single crystal semiconductor substrate 100 and the nitrogen-containing layer 121 is formed over the base substrate 120 has been described in this embodiment, the present invention is not limited thereto. For example, the oxide film 132 and the nitrogen-containing layer may be stacked in this order over the single crystal semiconductor substrate 100, and the surface of the nitrogen-containing layer formed over the oxide film 132 and the surface of the base substrate 120 may be bonded to each other. In this case, the nitrogen-containing layer may be provided before or after the embrittlement region 104 is formed. Note that an oxide film (for example, silicon oxide) may be formed over the nitrogen-containing layer, and the surface of the oxide film and the surface of the base substrate 120 may be bonded to each other.

In the case where the entry of an impurity to the single crystal semiconductor layer 124 from the base substrate 120 is not a problem, the surface of the oxide film 132 provided over the single crystal semiconductor substrate 100 and the surface of the base substrate 120 may be bonded to each other without providing the nitrogen-containing layer 121 over the base substrate 120.

In such a manner, as well as the single crystal semiconductor layer, the mark on the single crystal semiconductor substrate is transferred to the base substrate. After that, the single crystal semiconductor substrate is subjected again to printing with a laser, and then to reprocessing such as CMP. It is efficient that a step of printing a laser mark is performed simultaneously with the reprocessing. The semiconductor substrate which is subjected to the reprocessing returns to the beginning of this embodiment and is used as a new semiconductor substrate.

Note that the structure described in this embodiment can be implemented in combination with any of the structures described in the other embodiments in this specification, as appropriate.

Embodiment 3

In this embodiment, a method for manufacturing a semiconductor device using the SOI substrate which is manufactured in any of the above embodiments will be described.

First, a method for manufacturing an n-channel thin film transistor and a p-channel thin film transistor will be described with reference to FIGS. 5A to 5D and FIGS. 6A to 6C. Various types of semiconductor devices can be formed in combination with a plurality of thin film transistors (TFTs).

In this embodiment, the case where the SOI substrate manufactured through the steps in FIGS. 4A1 to 4A3, FIGS. 4B1 and 4B2, FIG. 4C, and FIG. 4D is used as an SOI substrate is described. It is needless to say that the SOI substrate manufactured by any of the other methods described in the above embodiments can also be used.

Figure 5A:
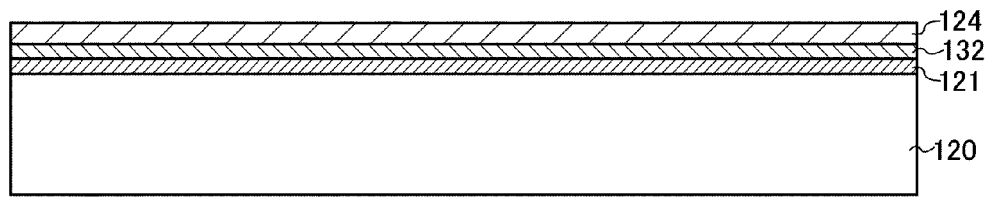
FIGS. 5A to 5D are views illustrating Embodiment 3.

FIG. 5A is a cross-sectional view of an SOI substrate manufactured using the method described with reference to FIGS. 4A1 to 4A3, FIGS. 4B1 and 4B2, FIG. 4C, and FIG. 4D.

Figure 5B:
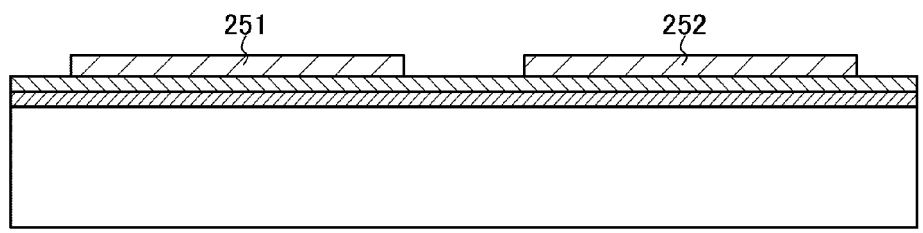

First, the single crystal semiconductor layer 124 is separated into elements by etching to form semiconductor layers 251 and 252 as illustrated in FIG. 5B. The semiconductor layer 251 is used for an n-channel TFT, and the semiconductor layer 252 is used for a p-channel TFT.

Figure 5C:
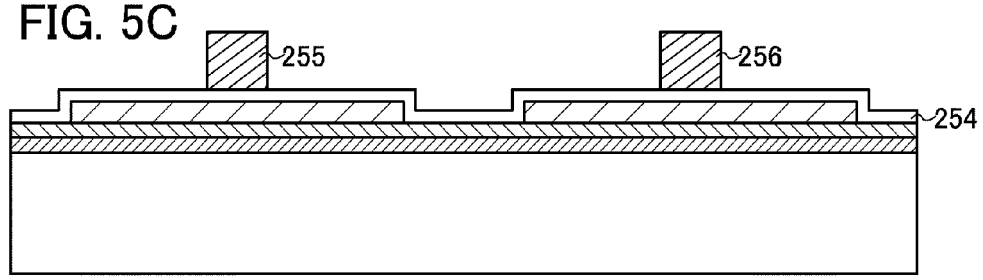

As illustrated in FIG. 5C, an insulating film 254 serving as a gate insulating film is formed over the semiconductor layers 251 and 252. Next, a gate electrode 255 is formed over the semiconductor layer 251 with the insulating film 254 interposed therebetween, and a gate electrode 256 is formed over the semiconductor layer 252 with the insulating film 254 interposed therebetween.

Note that before the single crystal semiconductor layer 124 is etched, it is preferable to add an impurity element such as boron, aluminum, or gallium or an impurity element such as phosphorus or arsenic to the single crystal semiconductor layer 124 in order to control the threshold voltage of the TFTs. For example, an impurity element is added to a region where the n-channel TFT is to be formed, and an impurity element is added to a region where the p-channel TFT is to be formed.

The insulating film 254 can be provided to have a single layer structure or a stacked structure using an insulating film of silicon oxide, silicon oxynitride, or silicon nitride by a CVD method, a sputtering method, a thermal oxidation method, or the like.

In addition, the semiconductor layers 251 and 252 may be subjected to plasma treatment, so that a surface of the insulating film 254 is oxidized or nitrided. For example, the insulating film 254 is formed by plasma treatment with a mixed gas of a rare gas such as He, Ar, Kr, or Xe, and oxygen, nitrogen oxide ($NO_2$), ammonia, nitrogen, hydrogen, or the like. In this case, if plasma is excited by introduction of a microwave, plasma with a low electron temperature and high density can be produced.

The surfaces of the single crystal semiconductor layers can be oxidized or nitrided by oxygen radicals (OH radicals may be included) or nitrogen radicals (NH radicals may be included) which are produced by this high-density plasma. By such treatment using high-density plasma, an insulating film having a thickness of 1 nm to 20 nm inclusive, typically 5 nm to 10 nm inclusive, is formed over the single crystal semiconductor layers. Since a reaction in this case is a solid-phase reaction, interface state density between the insulating film and the single crystal semiconductor layers can be made to be extremely low. Since the single crystal semiconductor layers are directly oxidized (or nitrided) by such high-density plasma treatment, variation in thickness of the formed insulating film can be made extremely small. By solid-phase oxidation of the surfaces of the single crystal semiconductor layers through such high-density plasma treatment, an insulating film which has favorable uniformity and low interface state density can be formed.

As for the insulating film 254, only the insulating film formed by high-density plasma treatment may be used, or one or more of insulating films of silicon oxide, silicon oxynitride, or silicon nitride may be deposited and stacked by a CVD method, a sputtering method, or the like. In any case, a transistor formed including the insulating film formed by high-density plasma treatment partly or wholly in the gate insulating film can have lower variation in its characteristics.

Figure 5D:
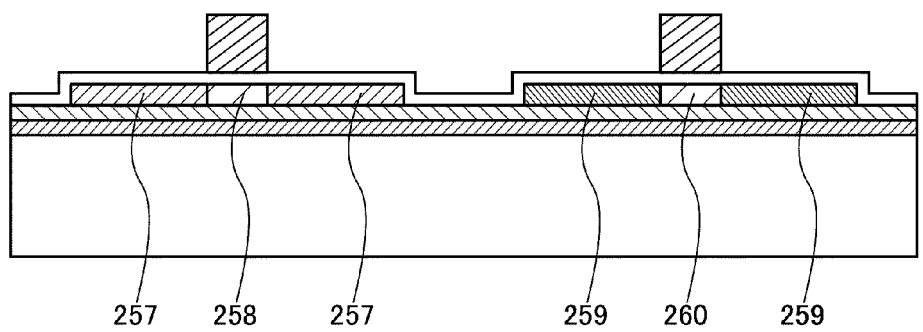

Next, as illustrated in FIG. 5D, n-type low-concentration impurity regions 257 are formed in the semiconductor layer 251, and p-type high-concentration impurity regions 259 are formed in the semiconductor layer 252. Specifically, first, the n-type low-concentration impurity regions 257 are formed in the semiconductor layer 251. In order to form the n-type low-concentration impurity regions 257, the semiconductor layer 252 where a p-channel TFT is to be formed is covered with a resist mask, and an impurity element is added to the semiconductor layer 251. As the impurity element, phosphorus or arsenic may be added. The impurity element is added by an ion doping method or an ion implantation method, whereby the gate electrode 255 serves as a mask, and the n-type low-concentration impurity regions 257 are formed in the semiconductor layer 251 in a self-aligned manner. A region of the semiconductor layer 251, which overlaps with the gate electrode 255, serves as a channel formation region 258.

Next, after the mask which covers the semiconductor layer 252 is removed, the semiconductor layer 251 where an n-channel TFT is to be formed is covered with a resist mask. Then, an impurity element is added to the semiconductor layer 252 by an ion doping method or an ion implantation method. As the impurity element, boron can be added. In the step of adding the impurity element, the gate electrode 256 serves as a mask, and the p-type high-concentration impurity regions 259 are formed in the semiconductor layer 252 in a self-aligned manner. The p-type high-concentration impurity regions 259 serve as a source region and a drain region. A region of the semiconductor layer 252, which overlaps with the gate electrode 256, serves as a channel formation region 260. Here, the method is described in which the p-type high-concentration impurity regions 259 are formed after the n-type low-concentration impurity regions 257 are formed; however, the p-type high-concentration impurity regions 259 can also be formed first.

Figure 6A:
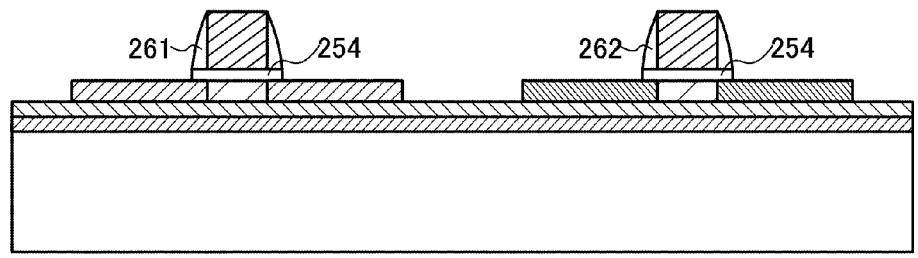
FIGS. 6A to 6C are views illustrating Embodiment 3.

Next, after the resist mask which covers the semiconductor layer 251 is removed, an insulating film having a single layer structure or a stacked layer structure, which includes a nitrogen compound such as silicon nitride or an oxide such as silicon oxide, is formed by a plasma CVD method or the like. This insulating film is anisotropically etched in a perpendicular direction, whereby sidewall insulating films 261 and 262 are formed in contact with side surfaces of the gate electrodes 255 and 256 respectively, as illustrated in FIG. 6A. By this anisotropic etching, the insulating film 254 is also etched.

Figure 6B:
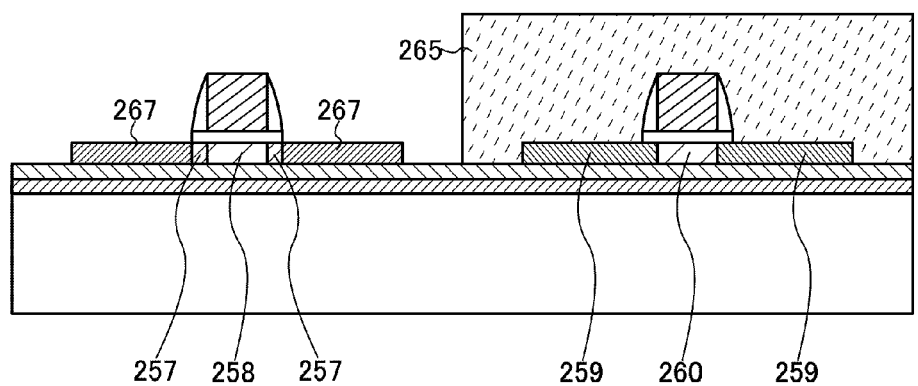

Next, as illustrated in FIG. 6B, the semiconductor layer 252 is covered with a resist 265. In order to form high-concentration impurity regions serving as a source region and a drain region in the semiconductor layer 251, an impurity element is added to the semiconductor layer 251 at high dose by an ion implantation method or an ion doping method. The gate electrode 255 and the sidewall insulating film 261 serve as a mask, and n-type high-concentration impurity regions 267 are formed. Next, heat treatment to activate the impurity element is performed.

Figure 6C:
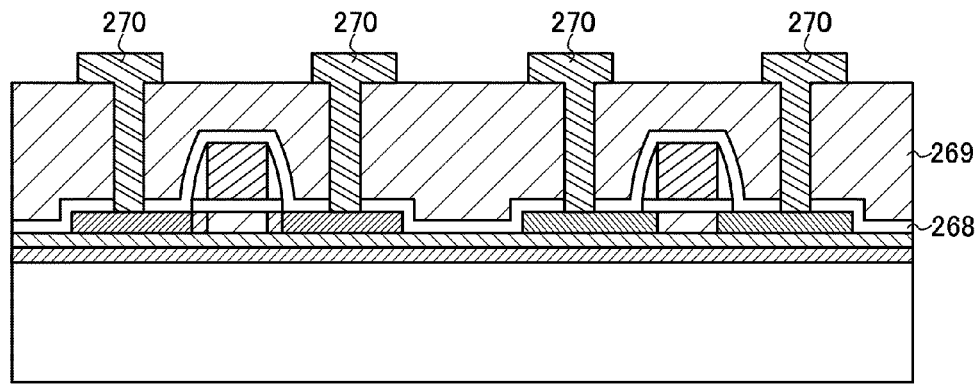

After the heat treatment to activate the impurity element, an insulating film 268 containing hydrogen is formed as illustrated in FIG. 6C. After the insulating film 268 is formed, heat treatment is performed at a temperature of 350° C. to 450° C. inclusive so that hydrogen contained in the insulating film 268 diffuses into the semiconductor layers 251 and 252. The insulating film 268 can be formed by deposition of silicon nitride or silicon nitride oxide by a plasma CVD method at a process temperature of 350° C. or less. By supply of hydrogen to the semiconductor layers 251 and 252, defects to serve as trapping centers in the semiconductor layers 251 and 252 and at the interface with the insulating film 254 can be repaired effectively.

Then, an interlayer insulating film 269 is formed. The interlayer insulating film 269 can be formed with a film having a single layer structure or a stacked layer structure selected from insulating films of inorganic materials, such as a silicon oxide film and a boron phosphorus silicon glass (BPSG) film, or organic resin films of polyimide, acrylic, and the like. Contact holes are formed in the interlayer insulating film 269, and wirings 270 are then formed as illustrated in FIG. 6C. The wirings 270 can be formed using a conductive film with a three-layer structure in which a low-resistance metal film such as an aluminum film or an aluminum-alloy film is sandwiched between barrier metal films, for example. The barrier metal films can each be formed using a metal film of molybdenum, chromium, titanium, or the like.

Through the steps described above, a semiconductor device having an n-channel TFT and a p-channel TFT can be manufactured.

The method for manufacturing TFTs is described with reference to FIGS. 5A to 5D and FIGS. 6A to 6C; however, a variety of semiconductor elements such as a capacitor or a resistor as well as the TFTs is formed, whereby a semiconductor device with high-added value can be manufactured. Specific modes of semiconductor devices are described below with reference to the drawings.

Figure 7:
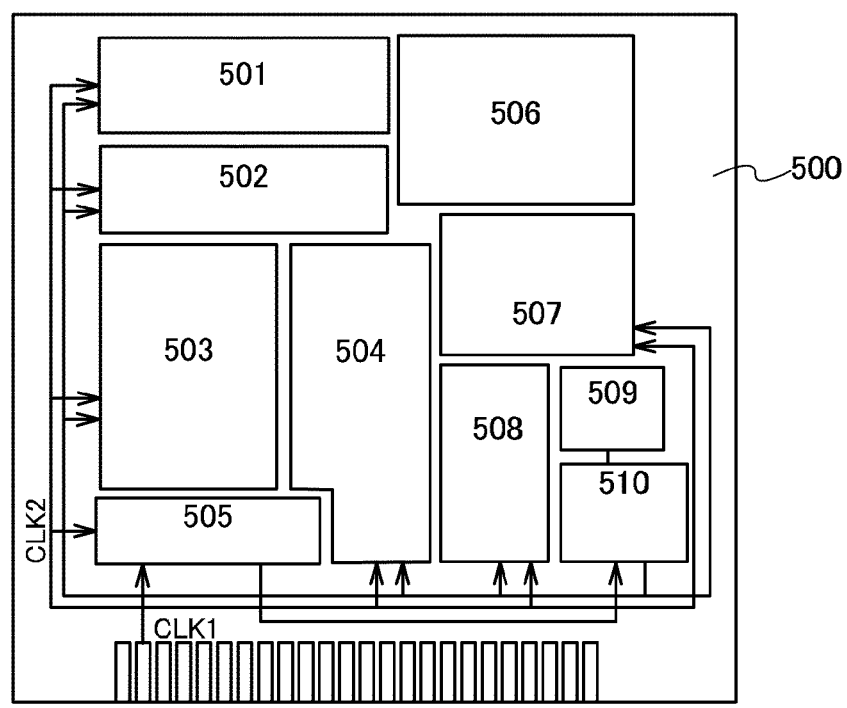
FIG. 7 is a diagram illustrating a configuration example of a microprocessor.

First, a microprocessor will be described as an example of semiconductor devices. FIG. 7 is a block diagram illustrating a structural example of a microprocessor 500.

The microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory 509, and a memory interface 510.

An instruction inputted to the microprocessor 500 through the bus interface 508 is inputted to the instruction decoder 503, decoded therein, and then inputted to the ALU controller 502, the interrupt controller 504, the register controller 507, and the timing controller 505. The ALU controller 502, the interrupt controller 504, the register controller 507, and the timing controller 505 conduct various controls based on the decoded instruction.

The ALU controller 502 generates signals to control the operation of the ALU 501. The interrupt controller 504 is a circuit which processes an interrupt request from an external input/output device or a peripheral circuit while the microprocessor 500 is executing a program, and the interrupt controller 504 processes an interrupt request based on its priority or a mask state. The register controller 507 generates an address of the register 506, and reads and writes data from and to the register 506 in accordance with the state of the microprocessor 500. The timing controller 505 generates signals which control timing of operation of the ALU 501, the ALU controller 502, the instruction decoder 503, the interrupt controller 504, and the register controller 507. For example, the timing controller 505 is provided with an internal clock generator which generates an internal clock signal CLK2 based on a reference clock signal CLK1. As illustrated in FIG. 7, the internal clock signal CLK2 is inputted to other circuits.

Figure 8:
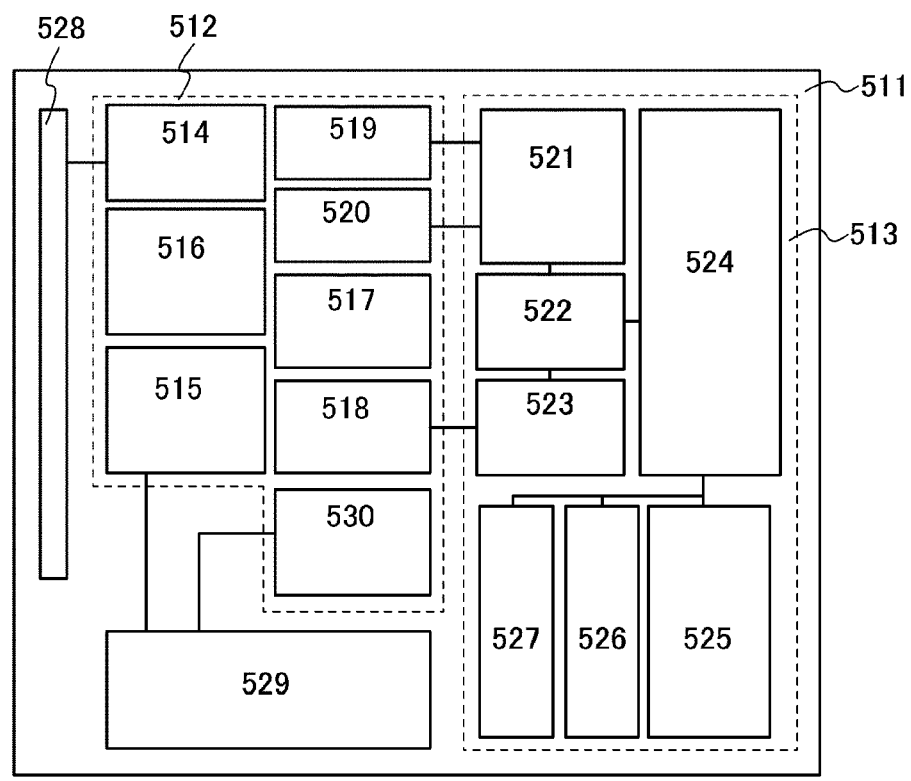
FIG. 8 is a diagram illustrating a configuration example of a semiconductor device.

Next, an example of a semiconductor device having an arithmetic function and a function of transmitting and receiving data without contact is described. FIG. 8 is a block diagram illustrating a structural example of such a semiconductor device. A semiconductor device illustrated in FIG. 8 can be called a computer that operates to transmit and receive signals to and from an external device by wireless communication (such a computer is hereinafter referred to as an "RFCPU").

As illustrated in FIG. 8, an RFCPU 511 has an analog circuit portion 512 and a digital circuit portion 513. The analog circuit portion 512 includes a resonance circuit 514 with a resonance capacitor, a rectifier circuit 515, a constant voltage circuit 516, a reset circuit 517, an oscillator circuit 518, a demodulator circuit 519, a modulator circuit 520, and a power management circuit 530. The digital circuit portion 513 includes an RF interface 521, a control register 522, a clock controller 523, a CPU interface 524, a central processing unit 525, a random-access memory 526, and a read-only memory 527.

The operation of the RFCPU 511 is roughly described below. The resonance circuit 514 generates induced electromotive force based on a signal received by an antenna 528. The induced electromotive force is stored in a capacitor portion 529 through the rectifier circuit 515. This capacitor portion 529 is preferably formed with a capacitor such as a ceramic capacitor or an electric double layer capacitor. The capacitor portion 529 is not necessarily integrated on a substrate included in the RFCPU 511 and can also be incorporated in the RFCPU 511 as a separate component.

The reset circuit 517 generates a signal which resets and initializes the digital circuit portion 513. For example, the reset circuit 517 generates, as a reset signal, a signal which rises after rise in a power supply voltage with delay. The oscillator circuit 518 changes the frequency and duty ratio of a clock signal in accordance with a control signal generated by the constant voltage circuit 516. The demodulator circuit 519 is a circuit which demodulates a received signal, and the modulator circuit 520 is a circuit which modulates data to be transmitted.

For example, the demodulator circuit 519 is formed using a low-pass filter and binarizes a received amplitude-modulated (ASK) signal based on variation of the amplitude. In order to vary the amplitude of an amplitude-modulated (ASK) transmission signal and transmit the signal, the modulator circuit 520 changes the amplitude of a communication signal by change of a resonance point of the resonance circuit 514.

The clock controller 523 generates a control signal to change the frequency and duty ratio of a clock signal in accordance with the power supply voltage or consumption current of the central processing unit 525. The power supply voltage is monitored by the power management circuit 530.

A signal inputted to the RFCPU 511 from the antenna 528 is demodulated by the demodulator circuit 519 and then decomposed into a control command, data, and the like by the RF interface 521. The control command is stored in the control register 522. The control command includes reading of data stored in the read-only memory 527, writing of data to the random-access memory 526, an arithmetic instruction to the central processing unit 525, and the like.

The central processing unit 525 accesses the read-only memory 527, the random-access memory 526, and the control register 522 via the CPU interface 524. The CPU interface 524 functions to generate an access signal for any of the read-only memory 527, the random-access memory 526, and the control register 522 based on an address requested by the central processing unit 525.

As an arithmetic method of the central processing unit 525, a method may be employed in which the read-only memory 527 stores an operating system (OS) and a program is read and executed at the time of starting operation. Alternatively, a method can be employed in which a dedicated arithmetic circuit is provided and arithmetic processing is conducted using hardware. In a method in which both hardware and software are used, part of arithmetic processing is conducted by a dedicated arithmetic circuit and the other part of the arithmetic processing is conducted by the central processing unit 525 using a program.

Next, display devices are described with reference to FIGS. 9A and 9B and FIGS. 10A and 10B.

Figure 9A:
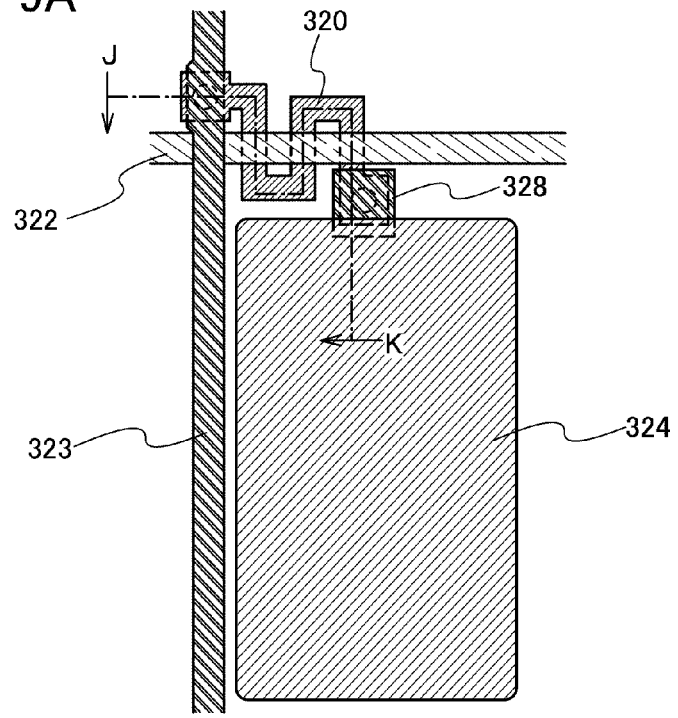
FIGS. 9A and 9B are views illustrating a liquid crystal display device.
Figure 9B:
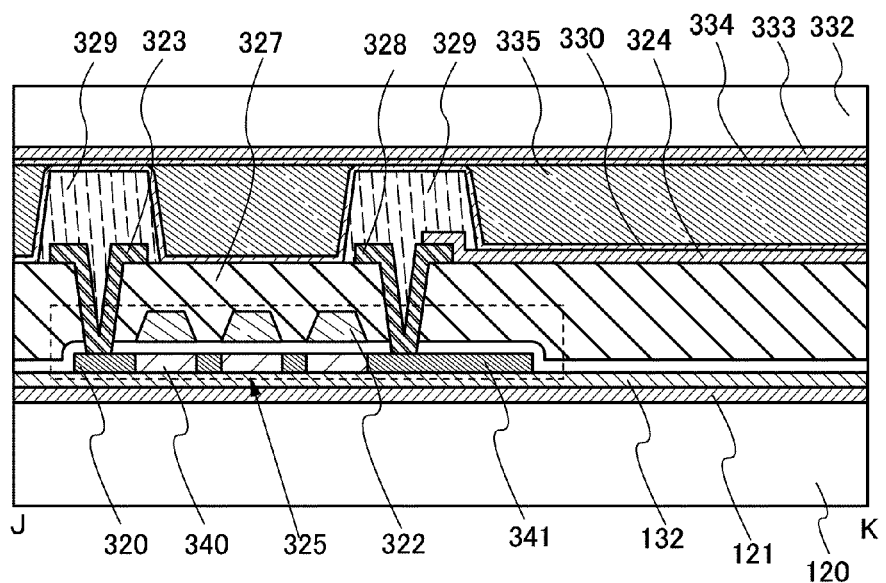

FIGS. 9A and 9B are drawings to describe a liquid crystal display device. FIG. 9A is a plan view of a pixel of the liquid crystal display device, and FIG. 9B is a cross-sectional view taken along section line J-K in FIG. 9A.

As illustrated in FIG. 9A, the pixel includes a single crystal semiconductor layer 320, a scan line 322 intersecting with the single crystal semiconductor layer 320, a signal line 323 intersecting with the scan line 322, a pixel electrode 324, and an electrode 328 which electrically connects the pixel electrode 324 and the single crystal semiconductor layer 320. The single crystal semiconductor layer 320 is a layer formed using the single crystal semiconductor layer provided over the base substrate 120 and is included in a TFT 325 of the pixel.

As an SOI substrate, the SOI substrate described in any of the above embodiments is used. As illustrated in FIG. 9B, the single crystal semiconductor layer 320 is stacked over the base substrate 120 with the oxide film 132 and the nitrogen-containing layer 121 interposed therebetween. As the base substrate 120, a glass substrate can be used. The single crystal semiconductor layer 320 of the TFT 325 is formed by element isolation of the single crystal semiconductor layer of the SOI substrate by etching. In the single crystal semiconductor layer 320, channel formation regions 340 and n-type high-concentration impurity regions 341 to which an impurity element is added are formed. A gate electrode of the TFT 325 is included in the scan line 322, and one of a source electrode and a drain electrode is included in the signal line 323.

Over an interlayer insulating film 327, the signal line 323, the pixel electrode 324, and the electrode 328 are provided. Over the interlayer insulating film 327, columnar spacers 329 are formed. An orientation film 330 is formed to cover the signal line 323, the pixel electrode 324, the electrode 328, and the columnar spacers 329. On a counter substrate 332, a counter electrode 333 and an orientation film 334 that covers the counter electrode 333 are formed. The columnar spacers 329 are formed to maintain a space between the base substrate 120 and the counter substrate 332. In the space formed by the columnar spacers 329, a liquid crystal layer 335 is formed. At connection portions between the signal line 323 and the electrode 328, and the high-concentration impurity regions 341, there are steps formed in the interlayer insulating film 327 due to formation of contact holes; thus, orientation of liquid crystal in the liquid crystal layer 335 in these connection portions are likely to be disordered. Accordingly, the columnar spacers 329 are formed in these step portions to prevent orientation disorder of liquid crystal.

Figure 10A:
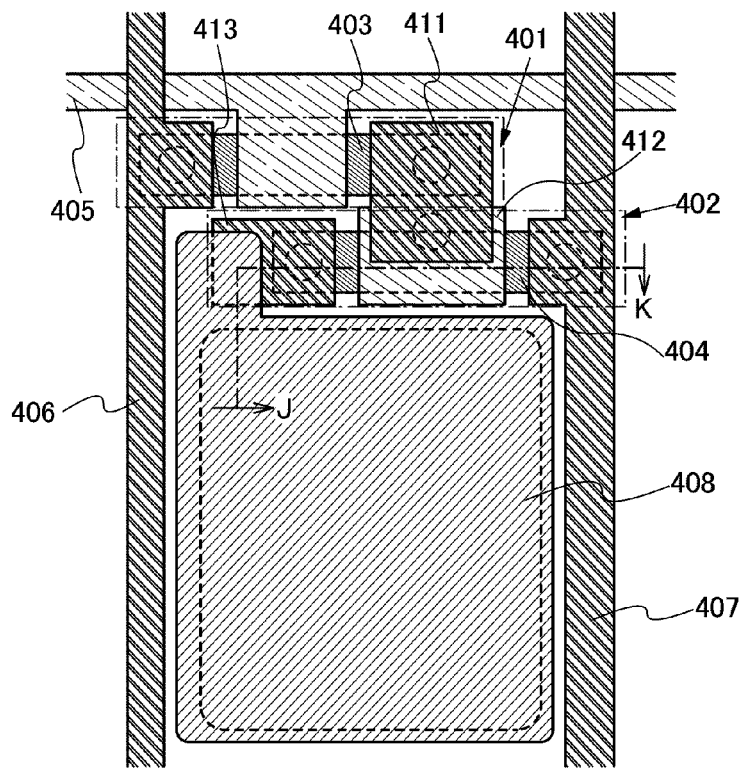
FIGS. 10A and 10B are views illustrating an EL display device.
Figure 10B:
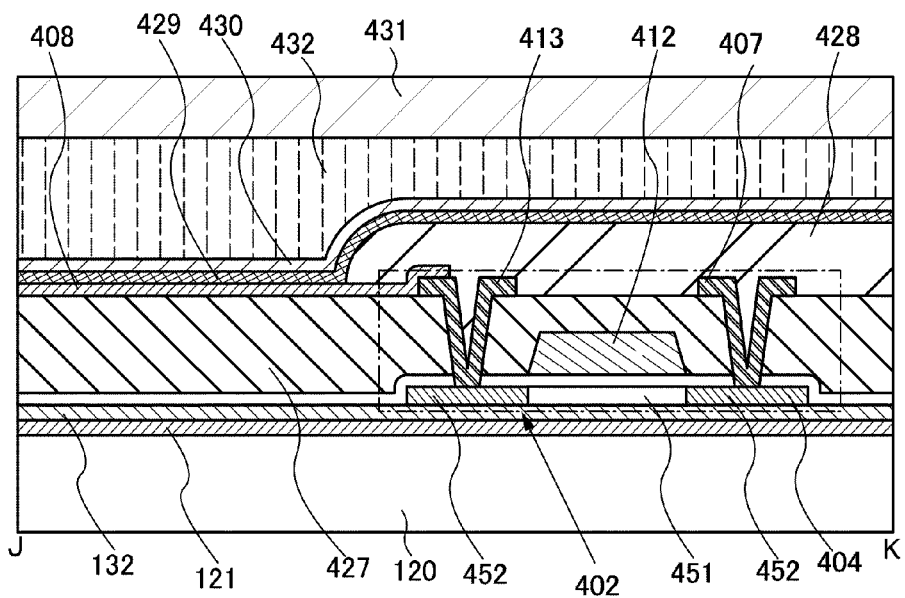

Next, an electroluminescent display device (hereinafter referred to as an EL display device) is described with reference to FIGS. 10A and 10B. FIG. 10A is a plan view of a pixel of the EL display device, and FIG. 10B is a cross-sectional view taken along section line J-K in FIG. 10A.

As illustrated in FIG. 10A, the pixel includes a selecting transistor 401 and a display control transistor 402 that are TFTs, a scan line 405, a signal line 406, a current supply line 407, and a pixel electrode 408. Each pixel is provided with a light-emitting element having a structure in which a layer containing an electroluminescent material (an EL layer) is interposed between a pair of electrodes. One of the electrodes of the light-emitting element is the pixel electrode 408. In a semiconductor layer 403, a channel formation region, a source region, and a drain region of the selecting transistor 401 are formed. In a semiconductor layer 404, a channel formation region, a source region, and a drain region of the display control transistor 402 are formed. The semiconductor layers 403 and 404 are formed using the single crystal semiconductor layer 124 provided over the base substrate.

In the selecting transistor 401, a gate electrode is included in the scan line 405; one of a source electrode and a drain electrode is included in the signal line 406; and the other is formed as an electrode 411. In the display control transistor 402, a gate electrode 412 is electrically connected to the electrode 411; one of a source electrode and a drain electrode is formed as an electrode 413 that is electrically connected to the pixel electrode 408; and the other is included in the current supply line 407.

The display control transistor 402 is a p-channel TFT. As illustrated in FIG. 10B, in the semiconductor layer 404, a channel formation region 451, and p-type high-concentration impurity regions 452 are formed. Note that as the SOI substrate, the SOI substrate manufactured in any of the embodiments is used.

An interlayer insulating film 427 is formed to cover the gate electrode 412 of the display control transistor 402. Over the interlayer insulating film 427, the signal line 406, the current supply line 407, the electrodes 411 and 413, and the like are formed. In addition, over the interlayer insulating film 427, the pixel electrode 408 that is electrically connected to the electrode 413 is formed. A peripheral portion of the pixel electrode 408 is surrounded by an insulating partition layer 428. An EL layer 429 is formed over the pixel electrode 408, and a counter electrode 430 is formed over the EL layer 429. A counter substrate 431 is provided as a reinforcing plate, and the counter substrate 431 is fixed to the base substrate 120 with a resin layer 432.

The grayscale of the EL display device is controlled by either a current drive method where the luminance of the light-emitting element is controlled by current or a voltage drive method where the luminance is controlled by voltage. The current drive method is difficult to be employed when transistors have characteristics which are largely different between pixels; therefore, a compensation circuit which compensates variation in characteristics is needed. When the EL display device is manufactured by a manufacturing method including a manufacturing process of an SOI substrate, the selecting transistor 401 and the display control transistor 402 do not have variation in characteristics from pixel to pixel. Accordingly, the current drive method can be employed.

That is, various electronic devices can be manufactured using SOI substrates. Examples of electronic devices include: cameras such as video cameras and digital cameras; navigation systems; audio reproducing devices (car audio systems, audio components, and the like); computers; game machines; portable information terminals (mobile computers, cellular phones, portable game machines, electronic book readers, and the like); image reproducing devices provided with recording media (specifically, devices that are each capable of reproducing audio data stored in a recording medium such as a digital versatile disc (DVD) and that each have a display device capable of displaying image data stored therein); and the like. An example of these electronic devices is illustrated in FIGS. 11A to 11C.

Figure 11A:
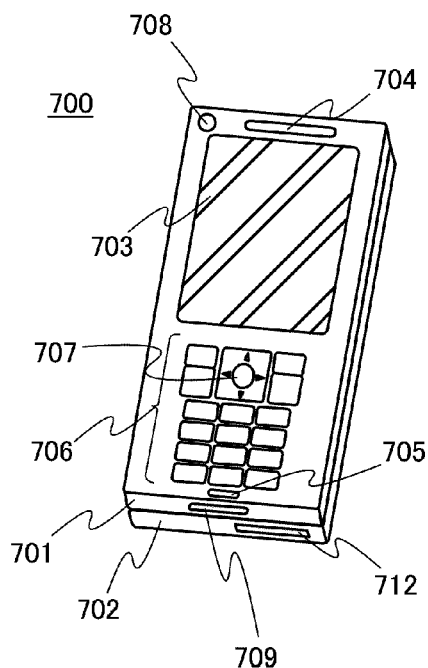
FIGS. 11A to 11C are views illustrating a cellular phone to which one embodiment of the present invention is applied.
Figure 11B:
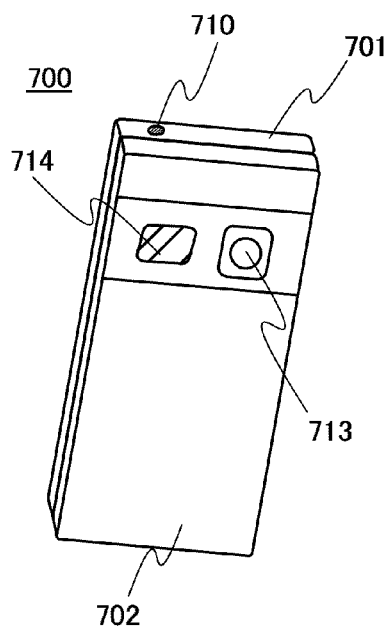
Figure 11C:
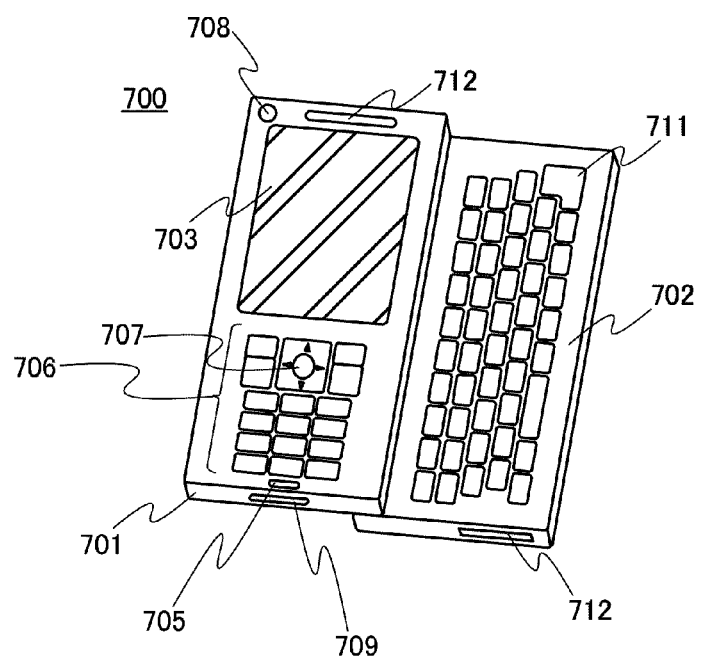

FIGS. 11A to 11C illustrate an example of a cellular phone to which one embodiment of the present invention is applied. FIG. 11A is a front view; FIG. 11B, a rear view; and FIG. 11C, a front view in which two housings are slid. A cellular phone 700 has two housings, a housing 701 and a housing 702. The cellular phone 700 is a so-called smartphone that has both a function as a cellular phone and a function as a portable information terminal and incorporates a computer to conduct a variety of data processing besides voice calls.

The cellular phone 700 has the housings 701 and 702. The housing 701 includes a display portion 703, a speaker 704, a microphone 705, operation keys 706, a pointing device 707, a front-face camera lens 708, an external connection terminal jack 709, an earphone terminal 710, and the like. The housing 702 includes a keyboard 711, an external memory slot 712, a rear-face camera 713, a light 714, and the like. In addition, an antenna is incorporated in the housing 701.

Further, in addition to the above components, the cellular phone 700 may incorporate a contactless IC chip, a small size memory device, or the like.

The housings 701 and 702 which overlap with each other (illustrated in FIG. 11A) can be developed by sliding as illustrated in FIG. 11C. The display portion 703 can incorporate a display panel or a display device to which the method for manufacturing the display device described in Embodiment 1 or 2 is applied. Since the display portion 703 and the front-face camera lens 708 are provided in the same plane, the cellular phone can be used as a videophone. In addition, still images and moving images can be taken with the rear-face camera 713 and the light 714 with the use of the display portion 703 as a viewfinder.

With the use of the speaker 704 and the microphone 705, the cellular phone 700 can be used as an audio recording device (recorder) or an audio reproducing device. With the operation keys 706, operation of incoming and outgoing calls, simple information input for electronic mail or the like, scrolling of a viewing area displayed on the display portion, cursor motion for selecting information displayed on the display portion, and the like are possible.

If much information needs to be handled, such as the case of creating documentation and using the cellular phone 700 as a portable information terminal, the use of the keyboard 711 is convenient. The housings 701 and 702 which overlap with each other (FIG. 11A) can be developed by sliding as illustrated in FIG. 11C. When the cellular phone is used as a portable information terminal, smooth operation can be conducted using the keyboard 711 and the pointing device 707. The external connection terminal jack 709 can be connected to an AC adaptor and various types of cables such as a USB cable, and charging and data communication with a personal computer or the like are possible. Moreover, a recording medium can be inserted into the external memory slot 712 so that a large volume of data can be stored and moved.

The housing 702 is provided with the rear-face camera 713 and the light 714 on its rear face (FIG. 11B), and still images and moving images can be taken using the display portion 703 as a viewfinder.

Furthermore, in addition to the above-described functions, the cellular phone 700 may also have an infrared communication function, a USB port, a television one-segment broadcasting receiving function, a contactless IC chip, an earphone jack, or the like.

The electronic device illustrated in FIGS. 11A to 11C can be manufactured by application of the aforementioned method for manufacturing a transistor and a display device.

Note that the structure described in this embodiment can be implemented in combination with any of the structures described in the other embodiments in this specification, as appropriate.

EXAMPLE 1

Figure 12:
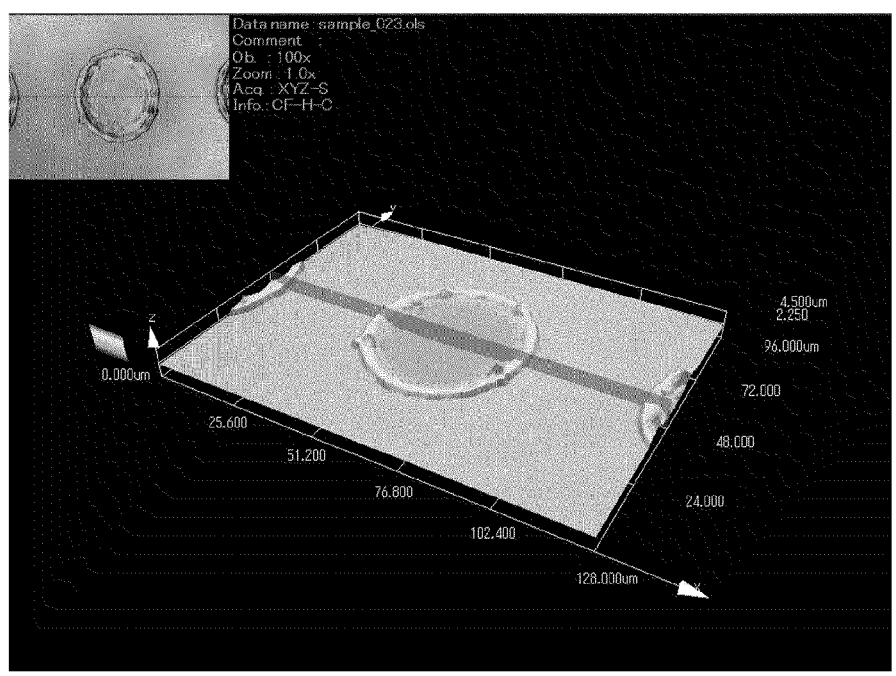
FIG. 12 is a view in which a printed portion before CMP treatment is observed.
Figure 13:
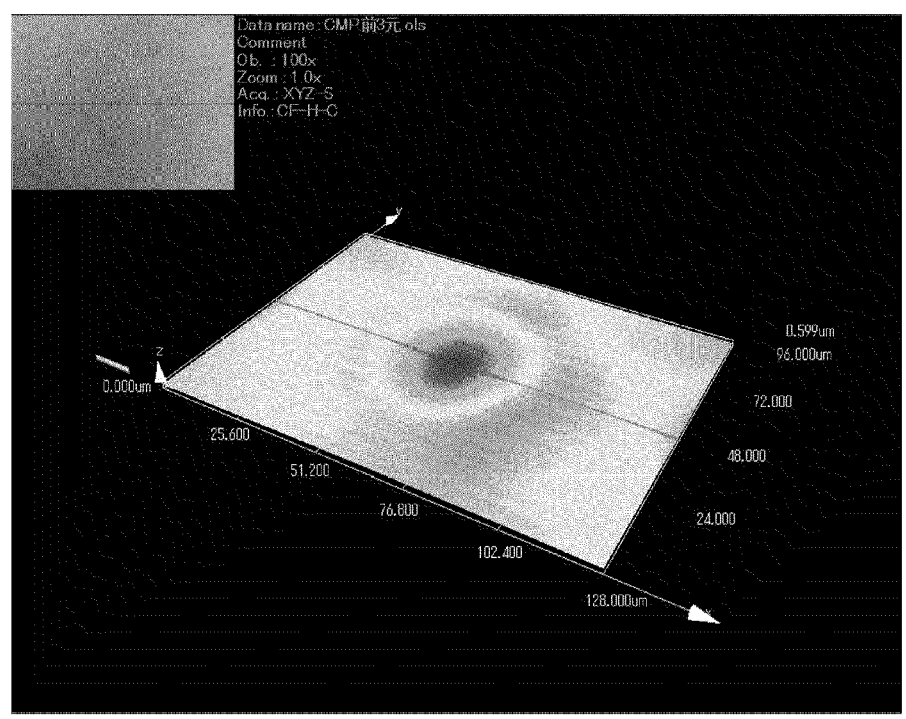
FIG. 13 is a view in which a printed portion after CMP treatment is observed.
Figure 14:
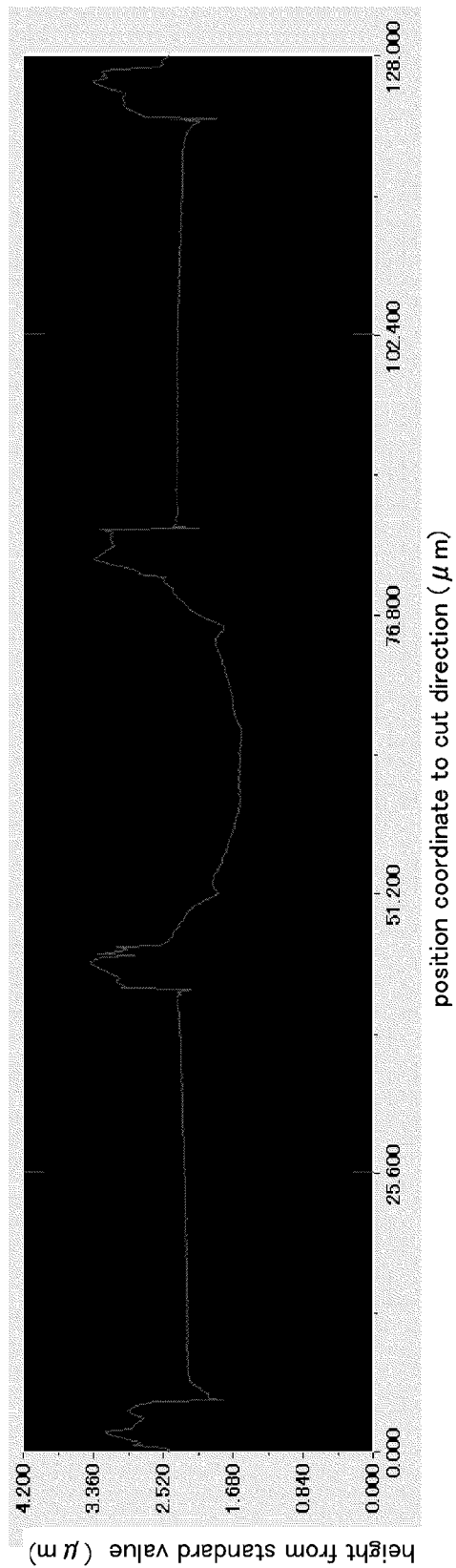
FIG. 14 shows a step profile before CMP treatment.
Figure 15:
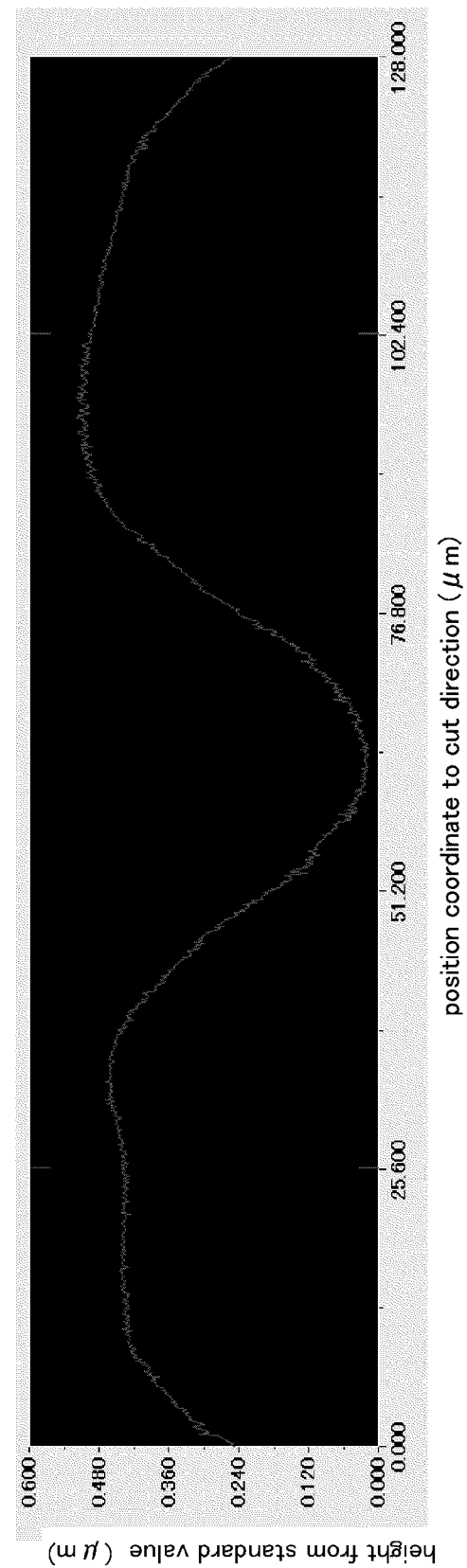
FIG. 15 shows a step profile after CMP treatment.
Figure 16:
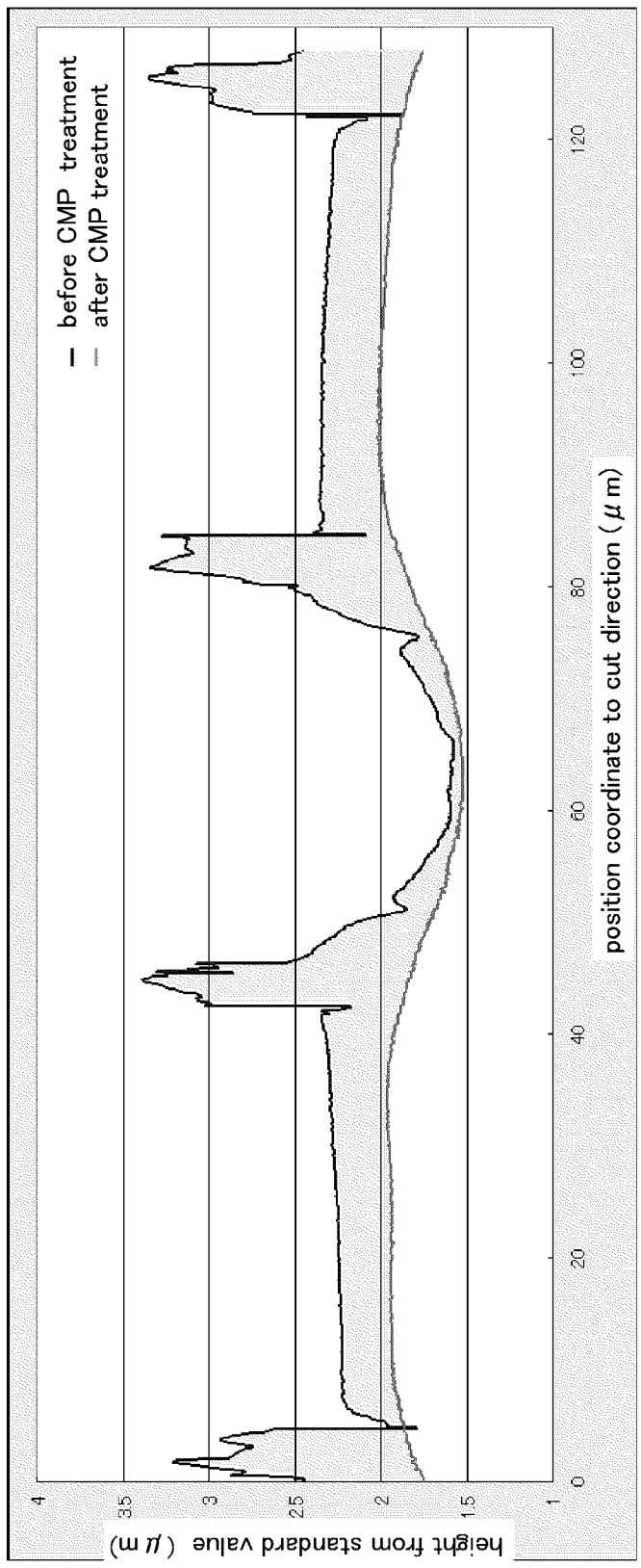
FIG. 16 shows respective step profiles before and after CMP treatment.
Figure 17:
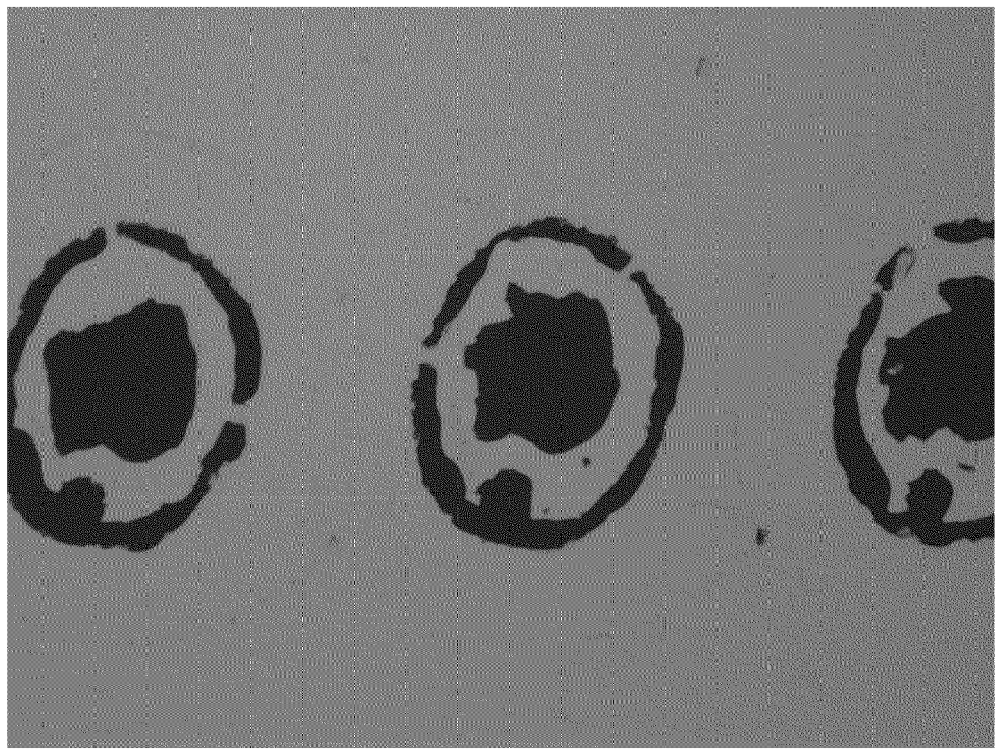
FIG. 17 shows a laser marker on a substrate after transfer.

FIG. 12 is a view in which a printed portion before CMP treatment is observed with a laser microscope. FIG. 13 is a view in which the printed portion after the CMP treatment is observed with a laser microscope. FIG. 14 is a view in which a step profile before the CMP treatment is observed with a laser microscope. FIG. 15 is a view in which a step profile after the CMP treatment is observed with a laser microscope. When FIG. 12 and FIG. 14 are compared to FIG. 13 and FIG. 15, it is apparent that although there are a hole due to a laser marker and an edge at an edge portion of the hole, the edge at the edge portion is removed and planarized by CMP. Accordingly, bonding of a semiconductor substrate and a glass substrate or the like can be kept favorable. FIG. 16 shows overlapping data of FIG. 14 and FIG. 15. It can be seen that the difference between a depression and a projection is approximately 2 μm before the CMP treatment and is approximately 0.5 μm after the CMP treatment. FIG. 17 is a view in which a laser marker trace after transfer is observed with an optical microscope. The transfer is performed on a glass substrate, whereby the laser marker can be observed sufficiently even with an optical microscope.

The present application is based on Japanese Patent Application serial No. 2008-303435 filed with Japan Patent Office on Nov. 28, 2008, the entire contents of which are hereby incorporated by reference.

What is claimed is:

1. A method for manufacturing a semiconductor device comprising the steps of:
    performing printing on a single crystal semiconductor substrate with a laser, thereby generating a projection at a peripheral portion of a printed portion;
    polishing the single crystal semiconductor substrate by chemical mechanical polishing to planarize the projection;
    forming an embrittlement region in the single crystal semiconductor substrate;
    bonding a surface of a base substrate and a surface of the single crystal semiconductor substrate; and
    separating the single crystal semiconductor substrate from the base substrate by heating the single crystal semiconductor substrate and the base substrate to form a single crystal semiconductor layer except for the printed portion over the base substrate.

2. The method for manufacturing a semiconductor device according to claim 1, wherein the base substrate has a light-transmitting property.

3. The method for manufacturing a semiconductor device according to claim 1, wherein a height of the projection is equal to or greater than 0.1 μm and equal to or less than 5 μm from the surface of the single crystal semiconductor substrate.

4. The method for manufacturing a semiconductor device according to claim 1, wherein the printing is performed at a depth of equal to or greater than 0.5 μm and equal to or less than 10 μm.

5. A method for manufacturing a semiconductor device comprising the steps of:
performing printing on a single crystal semiconductor substrate with a laser, thereby generating a projection at a peripheral portion of a printed portion;
polishing the single crystal semiconductor substrate by chemical mechanical polishing to planarize the projection;
forming a first embrittlement region in the single crystal semiconductor substrate;
bonding a surface of a first base substrate and a surface of the single crystal semiconductor substrate;
separating the single crystal semiconductor substrate from the first base substrate by heating the single crystal semiconductor substrate and the first base substrate to form a first single crystal semiconductor layer except for the printed portion over the first base substrate;
polishing the single crystal semiconductor substrate by chemical mechanical polishing to planarize the single crystal semiconductor substrate;
forming a second embrittlement region in the single crystal semiconductor substrate;
bonding a surface of a second base substrate and a surface of the single crystal semiconductor substrate; and
separating the single crystal semiconductor substrate from the second base substrate by heating the single crystal semiconductor substrate and the second base substrate to form a second single crystal semiconductor layer except for the printed portion over the second base substrate.

6. The method for manufacturing a semiconductor device according to claim 5, wherein the first base substrate and the second base substrate have a light-transmitting property.

7. The method for manufacturing a semiconductor device according to claim 5, wherein a height of the projection is equal to or greater than 0.1 μm and equal to or less than 5 μm from the surface of the single crystal semiconductor substrate.

8. The method for manufacturing a semiconductor device according to claim 5, wherein the printing is performed at a depth of equal to or greater than 0.5 μm and equal to or less than 10 μm.

9. A method for manufacturing a semiconductor device comprising the steps of:
performing first printing on a single crystal semiconductor substrate with a first laser, thereby generating a first projection at a first peripheral portion of a first printed portion;
polishing the single crystal semiconductor substrate by chemical mechanical polishing to planarize the first projection;
forming a first embrittlement region in the single crystal semiconductor substrate;
bonding a surface of a first base substrate and a surface of the single crystal semiconductor substrate;
separating the single crystal semiconductor substrate from the first base substrate by heating the single crystal semiconductor substrate and the first base substrate to form a first single crystal semiconductor layer except for the first printed portion over the first base substrate;
performing second printing on the single crystal semiconductor substrate with a second laser, thereby generating a second projection at a second peripheral portion of a second printed portion;
polishing the single crystal semiconductor substrate by chemical mechanical polishing to planarize the second projection;
forming a second embrittlement region in the single crystal semiconductor substrate;
bonding a surface of a second base substrate and a surface of the single crystal semiconductor substrate; and
separating the single crystal semiconductor substrate from the second base substrate by heating the single crystal semiconductor substrate and the second base substrate to form a second single crystal semiconductor layer except for at least the second printed portion over the second base substrate.

10. The method for manufacturing a semiconductor device according to claim 9, wherein the first projection are equal to or greater than 0.1 μm and equal to or less than 5 μm from the surface of the single crystal semiconductor substrate.

11. The method for manufacturing a semiconductor device according to claim 9, wherein the second projection are equal to or greater than 0.1 μm and equal to or less than 5 μm from the surface of the single crystal semiconductor substrate.

12. The method for manufacturing a semiconductor device according to claim 9, wherein the first printing and the second printing are performed at a depth of equal to or greater than 0.5 μm and equal to or less than 10 μm.

13. The method for manufacturing a semiconductor device according to claim 9, wherein the first base substrate and the second base substrate have a light-transmitting property.

* * * * *